United States Patent
Schowalter et al.

(10) Patent No.: US 10,612,156 B2
(45) Date of Patent: Apr. 7, 2020

(54) TWO-STAGE SEEDED GROWTH OF LARGE ALUMINUM NITRIDE SINGLE CRYSTALS

(71) Applicants: Leo J. Schowalter, Latham, NY (US); Robert T. Bondokov, Watervliet, NY (US); James R. Grandusky, Waterford, NY (US)

(72) Inventors: Leo J. Schowalter, Latham, NY (US); Robert T. Bondokov, Watervliet, NY (US); James R. Grandusky, Waterford, NY (US)

(73) Assignee: Crystal IS, Inc., Green Island, NY (US)

(*) Notice: Subject to any disclaimer, the term of this patent is extended or adjusted under 35 U.S.C. 154(b) by 0 days.

(21) Appl. No.: 16/513,796

(22) Filed: Jul. 17, 2019

(65) Prior Publication Data

US 2020/0010975 A1  Jan. 9, 2020

Related U.S. Application Data

(63) Continuation of application No. 16/008,407, filed on Jun. 14, 2018, now Pat. No. 10,407,798.

(Continued)

(51) Int. Cl.
| | |
|---|---|
| H01L 21/00 | (2006.01) |
| C30B 25/10 | (2006.01) |
| H01S 5/343 | (2006.01) |
| H01S 5/02 | (2006.01) |
| C30B 29/40 | (2006.01) |
| C30B 33/06 | (2006.01) |

(Continued)

(52) U.S. Cl.
CPC .............. *C30B 25/10* (2013.01); *C30B 23/00* (2013.01); *C30B 29/403* (2013.01); *C30B 33/06* (2013.01); *H01L 21/20* (2013.01); *H01S 5/0217* (2013.01); *H01S 5/34333* (2013.01); *H01L 33/0075* (2013.01); *H01L 33/0079* (2013.01); *H01L 33/06* (2013.01)

(58) Field of Classification Search
CPC ........ C30B 25/10; C30B 29/403; H01L 21/20
See application file for complete search history.

(56) References Cited

U.S. PATENT DOCUMENTS 7,449,065 B1 * 11/2008 Powell .................... C30B 11/14
117/108
8,747,552 B2 * 6/2014 Slack ..................... C30B 23/00
117/81

(Continued)

FOREIGN PATENT DOCUMENTS

| WO | 2007062250 A2 | 5/2007 | |
|---|---|---|---|
| WO | 2018232080 A1 | 12/2018 | |
| WO | WO-2018232080 A1 * | 12/2018 | ............. C30B 23/00 |

OTHER PUBLICATIONS

Kirste, R. et al., "Polarity control and growth of lateral polarity structures in AlN", Applied Physics Letters, 2013, vol. 102, Article No. 181913, pp. 181913-1-181913-4.

(Continued)

*Primary Examiner* — Laura M Menz
(74) *Attorney, Agent, or Firm* — Morgan, Lewis & Bockius LLP

(57) ABSTRACT

In various embodiments, growth of large, high-quality single crystals of aluminum nitride is enabled via a two-stage process utilizing two different crystalline seeds.

20 Claims, 7 Drawing Sheets

Related U.S. Application Data

(60) Provisional application No. 62/520,787, filed on Jun. 16, 2017.

(51) Int. Cl.
    *C30B 23/00*      (2006.01)
    *H01L 21/20*      (2006.01)
    *H01L 33/00*      (2010.01)
    *H01L 33/06*      (2010.01)

(56) References Cited

U.S. PATENT DOCUMENTS

| | | | | |
|---|---|---|---|---|
| 8,962,359 | B2* | 2/2015 | Schowalter | H01L 33/22 438/27 |
| 9,279,192 | B2* | 3/2016 | Hansen | C30B 23/025 |
| 9,299,880 | B2* | 3/2016 | Grandusky | H01L 33/0075 |
| 9,437,430 | B2* | 9/2016 | Schowalter | H01L 21/02389 |
| 10,407,798 | B2* | 9/2019 | Schowalter | H01S 5/34333 |
| 2003/0168003 | A1* | 9/2003 | Schowalter | C30B 11/003 117/106 |
| 2006/0005763 | A1* | 1/2006 | Schowalter | C30B 11/003 117/95 |
| 2007/0101932 | A1* | 5/2007 | Schowalter | C30B 11/003 117/84 |
| 2007/0243653 | A1* | 10/2007 | Morgan | C01B 21/0722 438/46 |
| 2008/0182092 | A1* | 7/2008 | Bondokov | C30B 23/00 428/220 |
| 2009/0283028 | A1* | 11/2009 | Schowalter | H01L 21/02389 117/9 |
| 2011/0008621 | A1* | 1/2011 | Schujman | C30B 23/00 428/402 |
| 2012/0000414 | A1* | 1/2012 | Bondokov | C30B 23/002 117/84 |
| 2015/0125717 | A1* | 5/2015 | Galazka | C30B 11/00 428/697 |
| 2015/0275393 | A1* | 10/2015 | Bondokov | C30B 29/403 117/104 |
| 2017/0159207 | A1 | 6/2017 | Schowalter et al. | |
| 2017/0204532 | A1* | 7/2017 | Land | C30B 25/02 |
| 2017/0226661 | A1* | 8/2017 | Bondokov | C30B 23/06 |
| 2018/0363164 | A1* | 12/2018 | Schowalter | C30B 25/10 |
| 2019/0106808 | A1* | 4/2019 | Bondokov | C30B 23/00 |

OTHER PUBLICATIONS

Balakrishnan, K. et al., "Study on the seeded growth of AlN bulk crystals by sublimation", Japanese Journal of Applied Physics, 2004, vol. 43, No. 11A, pp. 7448-7453.

International Search Report and the Written Opinion for international application No. PCT/US2018/037487 dated Oct. 2, 2018 11 pages.

* cited by examiner

TWO-STAGE SEEDED GROWTH OF LARGE ALUMINUM NITRIDE SINGLE CRYSTALS

RELATED APPLICATION

This is a continuation of U.S. patent application Ser. No. 16/008,407, filed Jun. 14, 2018, which application claims the benefit of and priority to U.S. Provisional Patent Application No. 62/520,787, filed Jun. 16, 2017, the entire disclosure of each of which is hereby incorporated herein by reference.

TECHNICAL FIELD

In various embodiments, the present invention relates to the fabrication of single-crystal aluminum nitride (AlN).

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of large, low-defect single crystals of AlN.

To make large-diameter AlN substrates more readily available and cost-effective, and to make the devices built thereon commercially feasible, it is desirable to grow large-diameter (>25 mm) AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), U.S. Pat. No. 7,776,153 (the '153 patent), and U.S. Pat. No. 9,028,612 (the '612 patent), the entire disclosures of which are incorporated by reference herein, describe various aspects of sublimation-recondensation growth of AlN, both seeded and unseeded.

During seeded growth of AlN, single crystals of AlN are nucleated on a high-quality single-crystal seed, and the growing crystals replicate the crystalline order of the exposed face of the seed. Moreover, the diameter of the growing crystal is often allowed to expand beyond the diameter of the seed; such "diameter expansion" enables the growth of large crystals while obviating the need to utilize seed crystals with large diameters, which is beneficial since large-area AlN seeds are often prohibitively expensive or simply unavailable. Such diameter expansion may be enabled via control of the radial and/or axial thermal gradients within the growth chamber during crystal growth, as detailed in the '612 patent. Growth of single-crystal AlN boules is often initiated from AlN seeds having an exposed c-plane face with Al polarity, as the subsequent growth of AlN crystals with the Al-polarity orientation proceeds at a high growth rate—higher than growth rates enabled at other crystalline orientations. While such techniques produce boules of high-quality material, they are susceptible to parasitic, or "secondary" nucleation at the edges of the crystals. Parasitic nucleation events can result in higher defect densities, or even polycrystalline crystals, and thus the usable, high-quality area of the AlN crystal boule is often limited. Parasitic nucleation is a particular problem during diameter expansion of Al-polarity AlN crystals, as the radial thermal gradients that enable diameter expansion from small seeds may increase the frequency of parasitic nucleation events. Therefore, there is a need for improved crystal growth sequences that enable the formation of high-quality large single crystals of AlN.

SUMMARY

In various embodiments of the present invention, growth of large, high-quality single crystals of AlN is enabled via a two-stage process utilizing seeds of different crystalline orientations. In the first stage of the process, a small-diameter single-crystal AlN seed having a c-face, N polarity is utilized to seed growth therefrom of a high-quality AlN crystal via sublimation-recondensation or another growth technique based on physical vapor transport (PVT). While only slow growth rates on the N-polarity orientation of the first seed are possible (this orientation has the slowest growth rate of all of the various possible AlN growth modes), the growth on the first seed suppresses or substantially eliminates parasitic nucleation events at the edge of the growing crystal. It is believed that the suppression of parasitic nucleation events is enabled via the relatively high spreading rate of a properly oriented island on the N-polarity AlN crystal in the lateral direction. That is, while the growth of the AlN single crystal proceeds slowly in the growth, or "axial" direction, the high spreading rate in the lateral direction results in the "coating" of any parasitic nuclei that form on the (000$\bar{1}$) facet (i.e., the (000-1) facet) of the crystal, and thus such nuclei do not grow into parasitic crystals that deleteriously impact the quality of the AlN boule. This very desirable feature is maintained so long as the growth rate is sufficiently slow. However, if one attempts to increase the growth rate by driving the (000-1) facet too far out of equilibrium, misoriented nuclei will form and grow quickly in the [000$\bar{1}$] direction (i.e., the [000-1] direction) because of the resulting supersaturation of growth species within the crystal-growth system. Under these circumstances, these misoriented nuclei will not have a chance to be overgrown by properly oriented nuclei that are expanding in the lateral direction.

Thus, while growth of the AlN crystal could, in theory, simply proceed via diameter expansion from an N-polarity seed, such growth also has disadvantages. As mentioned above, the N-polarity growth rate is the slowest growth rate for AlN crystals, rendering N-polarity growth time-consuming and therefore expensive in a commercial context. In addition, prolonged N-polarity growth may result in the formation of slow-growing growth facets within the crystal, and the growing crystal may transition from substantially circular to hexagonal in cross-section. Specifically, m-plane facets that are perpendicular to the (000-1) tend to form during prolonged N-polarity growth, and such facets retard or substantially stop the lateral expansion of the AlN crystal. Thus, embodiments of the present invention utilize a second stage of crystal growth that preserves the high crystalline quality of the first growth stage while enabling higher growth rates and continued diameter expansion. The diameter of the AlN single crystal is allowed to expand during the first growth stage to a "transition diameter" larger than the diameter of the initial N-polarity seed, whereupon the growth process is halted before the formation of slow-growing facets in the crystal (for example). The diameter expansion of the AlN single crystal may be controlled by control of the radial thermal gradient within the growth crucible, as detailed in the '612 patent. For example, the radial thermal gradient may be increased to promote diameter expansion until a desired diameter is obtained, whereupon the radial thermal gradient may be decreased (but typically not to zero) to slow or substantially eliminate further diameter expansion and to promote axial growth.

Because quality of the AlN single crystal may be compromised (via, e.g., formation of large-angle grain boundaries, polycrystalline growth, and/or other defects resulting from parasitic nucleation) if lateral growth (and concomitant diameter expansion) proceeds too rapidly (i.e., for a given amount of axial growth, which may be limited by the dimensions of the growth crucible or other aspects of the growth apparatus), the first growth stage may be repeated one or more times in order to obtain AlN single crystal having the desired transition diameter via N-polarity growth—after each first growth stage, a new, larger N-polarity seed may be cut from the resulting boule and utilized as the seed for the subsequent iteration. For example, diameter expansion of the AlN single crystal may be limited to a value ranging from approximately 0.5 mm to approximately 2 mm for each iteration of the first growth stage. In various embodiments, the diameter expansion during an iteration of N-polarity growth is limited to a value of less than or equal to approximately 2 mm for each 20 mm of axial growth of the crystalline boule.

After the one or more iterations of the first growth stage, the now-larger AlN single crystal is sliced to form a new growth seed for the second stage of the growth process. The new seed has a c face and an Al polarity and is utilized to form an even larger AlN single-crystal boule via the high growth rate enabled by the Al-polarity crystal face in combination with continued diameter expansion. The orientation of the new seed (and all seeds described herein) may be selected from a boule or other crystal during slicing via, for example, x-ray diffraction measurements and/or other materials characterization enabling identification of the orientation of the crystal; such techniques are known to those of skill in the art and may be performed without undue experimentation. In accordance with embodiments of the invention, a newly sliced seed may be polished to reduce surface roughness and remove cutting artifacts and/or damage.

The polarity of the seed may also be identified and selected chemically. For example, the seed polarity may be identified and selected via exposure of the seed to a basic or acidic solution, which will roughen an N-polarity face while leaving an Al-polarity face smooth. Examples of such treatments include exposing the seed for, e.g., 10-30 seconds to a KOH—NaOH eutectic melt at approximately 500° C., exposing the seed for, e.g., 30-90 seconds to a KOH aqueous solution at a temperature ranging from approximately 200° C. to approximately 350° C., or exposing the seed for, e.g., 30-90 seconds to a phosphoric acid aqueous solution at a temperature ranging from approximately 200° C. to approximately 300° C. After exposure, an N-polarity face will be roughened while an Al-polarity face will remain smooth and shiny. In this manner, an Al-polarity face may be selected and mounted within the crystal-growth chamber as the growth face of the seed for the second growth stage in accordance with embodiments of the present invention. Similarly, an N-polarity face of a seed may be identified in this fashion (e.g., for the first growth stage), and the roughness resulting from the chemical treatment may be removed (e.g., via a polishing technique such as CMP) before epitaxial growth on the seed, if desired.

In various embodiments of the invention, parasitic nucleation during the second growth stage is reduced or substantially eliminated via the greater control of the radial thermal gradient afforded by the use of the larger seed produced during the first growth stage. That is, the use of a seed having a diameter of at least the transition diameter surprisingly results in less (or substantially no) parasitic nucleation during diameter expansion, even at higher growth rates and/or diameter-expansion rates. For example, the radial thermal gradient in the growth crucible may be increased to enable diameter expansion during the second growth stage (or each iteration thereof) of at least 4 mm, at least 5 mm, at least 10 mm, or even more; such large radial thermal gradients would result in defective and/or polycrystalline growth (and/or deleterious facet formation) during the first growth stage. As with the first growth stage, the second growth stage may be repeated one or more times in order to obtain AlN single crystal having the desired final diameter via Al-polarity growth. In various embodiments of the invention, the diameter expansion during Al-polarity growth may be at least approximately 10 mm to approximately 20 mm (or more) for each 20 mm of axial growth of the crystalline boule. (As utilized herein, diameter expansion rates "for each X mm of axial growth" apply even if the amount of axial growth is less than X mm and may be scaled accordingly based on the actual or desired amount of axial growth. For example, a diameter expansion of approximately 20 mm for each 20 mm of axial growth corresponds to a diameter expansion of approximately 1 mm for each 1 mm of axial growth.)

Thus, in embodiments of the invention the transition diameter of the AlN crystal at which the growth process is transitioned from the first stage to the second stage may be (1) smaller than that at which N-polarity growth results in formation of slow-growth facets and formation of non-circular crystals, and (2) sufficiently large to support formation thereon of a radial thermal gradient having a magnitude adequate to suppress parasitic edge nucleation (and/or, e.g., formation of large-angle grain boundaries and/or other defects) during Al-polarity growth. In various embodiments of the invention, the transition diameter ranges from approximately 10 mm to approximately 40 mm, or even from approximately 15 mm to approximately 25 mm. The second growth stage may involve continued diameter expansion to crystal diameters of, for example, 100 mm, 150 mm, or even larger. In some embodiments, diameter expansion is halted during the second growth stage via manipulation (e.g., flattening, or even substantial elimination) of the radial thermal gradient within the growth chamber and/or because the diameter of the crystal increases to match the inner diameter of the growth chamber. The length of the crystal boule produced by the second growth stage may be quite large. In various embodiments, the length of the boule may be limited only by the inner dimensions of the growth chamber and/or by the size of the furnace utilized to produce the thermal growth environment within the growth chamber.

In various embodiments of the present invention, the radial and/or axial thermal gradients within the crystal-growth crucible utilized to promote and control the axial growth and diameter expansion of the AlN material may be controlled in various different manners. For example, individual heating elements arranged around the crucible may be powered to different levels (and thus different temperatures) to establish thermal gradients within the crucible. In addition or instead, thermal insulation may be selectively arranged around the crucible such that thinner and/or less insulating insulation is positioned around areas of higher desired temperature. As detailed in the '612 patent, thermal shields may also be arranged around the crucible, e.g., above and/or below the crucible, in any of a multitude of different arrangements in order to establish desired thermal gradients within the crucible. In various embodiments, isotherms of the thermal gradient may be concave (viewed along the axial growth direction) during diameter expansion and substantially flat during axial growth with diameter expansion minimized or substantially eliminated.

Although embodiments of the invention have been presented herein utilizing AlN as the exemplary crystalline material fabricated in accordance therewith, embodiments of the invention may also be applied to other crystalline materials such as silicon carbide (SiC) and zinc oxide (ZnO); thus, herein, all references to AlN herein may be replaced, in other embodiments, by SiC or ZnO. As utilized herein, the term "diameter" refers to a lateral dimension (e.g., the largest lateral dimension) of a crystal, growth chamber, or other object, even if the crystal, growth chamber, or other object is not circular and/or is irregular in cross-section.

As utilized herein, a "substrate" or a "wafer" is a portion of a previously grown crystalline boule having top and bottom opposed, generally parallel surfaces. Substrates typically have thicknesses ranging between 200 μm and 1 mm and may be utilized as platforms for the epitaxial growth of semiconductor layers and the fabrication of semiconductor devices (e.g., light-emitting devices such as lasers and light-emitting diodes, transistors, power devices, etc.) thereon. As utilized herein, "room temperature" is 25° C.

In an aspect, embodiments of the invention feature a method of forming single-crystal aluminum nitride (AlN). A first seed crystal is provided or disposed within a first growth chamber. The first seed crystal includes, consists essentially of, or consists of AlN (e.g., doped or undoped AlN). The first seed crystal has a growth face having an N polarity. The first growth chamber is heated, whereby a first radial thermal gradient and a first axial thermal gradient are formed within the first growth chamber. Vapor including, consisting essentially of, or consisting of aluminum and nitrogen is condensed within the first growth chamber, thereby forming on the growth face of the first seed a first AlN single crystal that (a) increases in size along a growth direction in response to the first axial thermal gradient and (b) increases in size along a radial direction substantially perpendicular to the growth direction in response to the first radial thermal gradient. Condensation of the vapor within the first growth chamber is ceased after a diameter of the first AlN single crystal increases to a transition diameter greater than a diameter of the first seed crystal. A second seed crystal is separated from the first AlN single crystal. The second seed crystal includes, consists essentially of, or consists of AlN (e.g., doped or undoped AlN). The second seed crystal has a diameter larger than a diameter of the first seed crystal. The second seed crystal has a growth face having an Al polarity. The second seed crystal is provided or disposed within a second growth chamber. The second growth chamber is heated, whereby a second radial thermal gradient and a second axial thermal gradient are formed within the second growth chamber. Vapor including, consisting essentially of, or consisting of aluminum and nitrogen is condensed within the second growth chamber, thereby forming on the growth face of the second seed a second AlN single crystal that increases in size along the growth direction in response to the second axial thermal gradient.

Embodiments of the invention may include one or more of the following in any of a variety of combinations. The first growth chamber may be the same as the second growth chamber. The first growth chamber may be different from the second growth chamber. During at least a portion of the formation of the second AlN single crystal, the second AlN single crystal may increase in size along the radial direction in response to the second radial thermal gradient. The second AlN single crystal may be separated into one or more AlN substrates. Each of the AlN substrates may have a diameter larger than the diameter of the first seed crystal and/or larger than the diameter of the first seed crystal. The second radial thermal gradient may be larger than the first radial thermal gradient. A growth rate of the second AlN single crystal may be larger than a growth rate of the first AlN single crystal. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm.

A single-crystal AlN substrate may be separated from the second AlN single crystal. A light-emitting device structure may be formed over the single-crystal AlN substrate to form a light-emitting device. The light-emitting device may be configured to emit visible or ultraviolet light. After forming at least a portion of the light-emitting device structure, at least a portion of the single-crystal AlN substrate may be removed from the light-emitting device. The light-emitting device may include, consist essentially of, or consist of a light-emitting diode or a laser.

In another aspect, embodiments of the invention feature a method of forming single-crystal aluminum nitride (AlN). In a step (a), a first seed crystal is provided. The first seed crystal includes, consists essentially of, or consists of AlN (e.g., doped or undoped AlN). The first seed crystal has a growth face having an N polarity. In a step (b), single-crystal AlN is deposited on the first seed crystal (e.g., on the growth face of the first seed crystal) within a first growth chamber. In a step (c), during at least some of the deposition of single-crystal AlN on the first seed crystal, diameter expansion is induced such that at least a portion of the single-crystal AlN has a diameter greater than a diameter of the first seed crystal. In a step (d), a new first seed crystal is separated from the single-crystal AlN after deposition of the single-crystal AlN on the first seed crystal. The new first seed crystal has a diameter greater than the diameter of the first seed crystal. The new first seed crystal has a growth face having an N polarity. In a step (e), steps (b) and (c) are repeated using the new first seed crystal produced in step (d). In a step (f), after step (e), a second seed crystal is separated from the single-crystal AlN deposited on the new first seed crystal. The second seed crystal includes, consists essentially of, or consists of AlN (e.g., doped or undoped AlN). The second seed crystal has a growth face having an Al polarity.

Embodiments of the invention may include one or more of the following in any of a variety of combinations. In a step (g), single-crystal AlN may be deposited on the second seed crystal within a second growth chamber. The first growth chamber may be the same as the second growth chamber. The first growth chamber may be different from the second growth chamber. During a step (h), during at least some of the deposition of single-crystal AlN on the second seed crystal, diameter expansion may be induced such that at least a portion of the single-crystal AlN has a diameter greater than a diameter of the second seed crystal. The diameter expansion during step (h) may be, for each 20 mm of axial growth of the single-crystal AlN, at least approximately 10 mm, at least approximately 15 mm, at least approximately 20 mm, or at least approximately 25 mm. The diameter expansion during step (h) may be, for each 20 mm of axial growth of the single-crystal AlN, at most approximately 50 mm, at most approximately 35 mm, at most approximately 30 mm, at most approximately 25 mm, or at most approximately 20 mm. In a step (i), after deposition of the single-crystal AlN on the second seed crystal, a new second seed crystal may be separated from the single-crystal AlN. The new second seed crystal may have a diameter greater than the diameter of the second seed crystal. In a step (j), steps (g) and (h) may be repeated using the new second seed crystal produced in step (i). Steps (i) and (j) may be repeated one or more times.

A single-crystal AlN substrate may be separated from the single-crystal AlN produced during steps (g) and (h). A light-emitting device structure may be formed over the single-crystal AlN substrate to form a light-emitting device. The light-emitting device may be configured to emit visible or ultraviolet light. After forming at least a portion of the light-emitting device structure, at least a portion of the single-crystal AlN substrate may be removed from the light-emitting device. The light-emitting device may include, consist essentially of, or consist of a light-emitting diode or a laser.

Steps (d) and (e) may be repeated one or more times before step (f). The diameter expansion in step (c) may be, for each 20 mm of axial growth of the single-crystal AlN, at most approximately 5 mm, at most approximately 4 mm, at most approximately 3 mm, at most approximately 2 mm, at most approximately 1.5 mm, at most approximately 1 mm, or at most approximately 0.5 mm. In step (f) the diameter of the second seed crystal may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The diameter of the second seed crystal in step (f) may be at least 5 mm, at least 6 mm, at least 7 mm, at least 8 mm, at least 9 mm, or at least 10 mm.

In yet another aspect, embodiments of the invention feature a method of forming single-crystal aluminum nitride (AlN). In a step (a), a first seed crystal is provided. The first seed crystal includes, consists essentially of, or consists of AlN (e.g., doped or undoped AlN). The first seed crystal has a growth face having an N polarity. In a step (b), single-crystal AlN is deposited on the first seed crystal (e.g., on the growth face of the first seed crystal) within a first growth chamber. In a step (c), during at least some of the deposition of single-crystal AlN on the first seed crystal, diameter expansion is induced such that at least a portion of the single-crystal AlN has a diameter greater than a diameter of the first seed crystal. In a step (d), after step (c), a second seed crystal is separated from the single-crystal AlN deposited on the first seed crystal. The second seed crystal includes, consists essentially of, or consists of AlN (e.g., doped or undoped AlN). The second seed crystal has a growth face having an Al polarity. The second seed crystal has a diameter greater than the diameter of the first seed crystal. In a step (e), single-crystal AlN is deposited on the second seed crystal within a second growth chamber.

Embodiments of the invention may include one or more of the following in any of a variety of combinations. In a step (f), during at least some of the deposition of single-crystal AlN on the second seed crystal, diameter expansion may be induced such that at least a portion of the single-crystal AlN has a diameter greater than a diameter of the second seed crystal. During a step (g), after deposition of the single-crystal AlN on the second seed crystal, a new second seed crystal may be separated from the single-crystal AlN. The new second seed crystal may have a diameter greater than the diameter of the second seed crystal. During a step (h), steps (e) and (f) may be repeated using the new second seed crystal produced in step (g). The diameter expansion during step (f) may be, for each 20 mm of axial growth of the single-crystal AlN, at least approximately 10 mm, at least approximately 15 mm, at least approximately 20 mm, or at least approximately 25 mm. The diameter expansion during step (f) may be, for each 20 mm of axial growth of the single-crystal AlN, at most approximately 50 mm, at most approximately 35 mm, at most approximately 30 mm, at most approximately 25 mm, or at most approximately 20 mm. Steps (g) and (h) may be repeated one or more times.

During at least some of the deposition of single-crystal AlN on the second seed crystal, diameter expansion may be induced such that at least a portion of the single-crystal AlN has a diameter greater than a diameter of the second seed crystal. The diameter expansion during deposition of single-crystal AlN on the second seed crystal may be, for each 20 mm of axial growth of the single-crystal AlN, at least approximately 10 mm, at least approximately 15 mm, at least approximately 20 mm, or at least approximately 25 mm. The diameter expansion during deposition of single-crystal AlN on the second seed crystal may be, for each 20 mm of axial growth of the single-crystal AlN, at most approximately 50 mm, at most approximately 35 mm, at most approximately 30 mm, at most approximately 25 mm, or at most approximately 20 mm.

A single-crystal AlN substrate may be separated from the single-crystal AlN deposited on the second seed crystal. A light-emitting device structure may be formed over the single-crystal AlN substrate to form a light-emitting device. The light-emitting device may be configured to emit visible or ultraviolet light. After forming at least a portion of the light-emitting device structure, at least a portion of the single-crystal AlN substrate may be removed from the light-emitting device. The light-emitting device may include, consist essentially of, or consist of a light-emitting diode or a laser.

The diameter of the second seed crystal may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The diameter of the second seed crystal may be at least 5 mm, at least 6 mm, at least 7 mm, at least 8 mm, at least 9 mm, or at least 10 mm.

The diameter expansion in step (c) may be, for each 20 mm of axial growth of the single-crystal AlN, at most approximately 5 mm, at most approximately 4 mm, at most approximately 3 mm, at most approximately 2 mm, at most approximately 1.5 mm, at most approximately 1 mm, or at most approximately 0.5 mm. The first growth chamber may be the same as the second growth chamber. The first growth chamber may be different from the second growth chamber. In step (c), the diameter of the at least a portion of the single-crystal AlN may not exceed a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm.

In another aspect, embodiments of the invention feature a method of forming single-crystal aluminum nitride (AlN). In a step (a), a first seed crystal is provided. The first seed crystal includes, consists essentially of, or consists of AlN (e.g., doped or undoped AlN). In a step (b), single-crystal AlN is deposited on the first seed crystal (e.g., on a growth face of the first seed crystal) within a first growth chamber. In a step (c), during at least some of the deposition of single-crystal AlN on the first seed crystal, diameter expansion is induced such that at least a portion of the single-crystal AlN has a diameter greater than a diameter of the first seed crystal. The diameter expansion proceeds at a first expansion rate. In a step (d), after step (c), a second seed crystal is separated from the single-crystal AlN deposited on the first seed crystal. The second seed crystal includes, consists essentially of, or consists of AlN (e.g., doped or undoped AlN). The second seed crystal has a diameter greater than the diameter of the first seed crystal. In a step (e), single-crystal AlN is deposited on the second seed crystal within a second growth chamber. In a step (f), during at least some of the deposition of single-crystal AlN on the second seed crystal, diameter expansion is induced such that at least a portion of the single-crystal AlN has a diameter greater than a diameter of the second seed crystal. The diameter expansion proceeds at a second expansion rate larger than the first expansion rate.

Embodiments of the invention may include one or more of the following in any of a variety of combinations. The first seed crystal and/or the second seed crystal may have a c growth face. The first seed crystal may have a growth face having an N polarity. The second seed crystal may have a growth face having an Al polarity. The diameter of the second seed crystal may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The diameter of the second seed crystal may be at least 5 mm, at least 6 mm, at least 7 mm, at least 8 mm, at least 9 mm, or at least 10 mm.

The first expansion rate may be, for each 20 mm of axial growth of the single-crystal AlN, at most approximately 5 mm, at most approximately 4 mm, at most approximately 3 mm, at most approximately 2 mm, at most approximately 1.5 mm, at most approximately 1 mm, or at most approximately 0.5 mm. The second expansion rate may be, for each 20 mm of axial growth of the single-crystal AlN, at least approximately 10 mm, at least approximately 15 mm, at least approximately 20 mm, or at least approximately 25 mm. The second expansion rate may be, for each 20 mm of axial growth of the single-crystal AlN, at most approximately 50 mm, at most approximately 35 mm, at most approximately 30 mm, at most approximately 25 mm, or at most approximately 20 mm. The first growth chamber may be the same as the second growth chamber. The first growth chamber may be different from the second growth chamber.

In step (c), the diameter of the at least a portion of the single-crystal AlN may not exceed a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm.

A single-crystal AlN substrate may be separated from the single-crystal AlN deposited on the second seed crystal. A light-emitting device structure may be formed over the single-crystal AlN substrate to form a light-emitting device. The light-emitting device may be configured to emit visible or ultraviolet light. After forming at least a portion of the light-emitting device structure, at least a portion of the single-crystal AlN substrate may be removed from the light-emitting device. The light-emitting device may include, consist essentially of, or consist of a light-emitting diode or a laser.

In yet another aspect, embodiments of the invention feature a crystal assemblage that includes, consists essentially of, or consists of a first seed crystal having a growth surface, a first single-crystal AlN boule extending from the growth surface of the first seed crystal, a second seed crystal having a growth surface, and a second single-crystal AlN boule extending from the growth surface of the second seed crystal. The first seed crystal includes, consists essentially of, or consists of AlN (e.g., doped or undoped AlN). The growth face of the first seed crystal has an N polarity. The first seed crystal has a first diameter. A diameter of at least a portion of the first boule exceeds the first diameter and increases, for each 20 mm of axial length, at most approximately 5 mm, at most approximately 4 mm, at most approximately 3 mm, at most approximately 2 mm, at most approximately 1.5 mm, at most approximately 1 mm, or at most approximately 0.5 mm. The second seed crystal includes, consists essentially of, or consists of AlN (e.g., doped or undoped AlN). The growth face of the second seed crystal has an Al polarity. The second seed crystal has a second diameter greater than the first diameter. A diameter of at least a portion of the second boule exceeds the second diameter and increases, for each 20 mm of axial length, at least approximately 10 mm, at least approximately 15 mm, at least approximately 20 mm, or at least approximately 25 mm. The diameter of the at least a portion of the second boule may increase, for each 20 mm of axial growth of the single-crystal AlN, at most approximately 50 mm, at most approximately 35 mm, at most approximately 30 mm, at most approximately 25 mm, or at most approximately 20 mm.

Embodiments of the invention may include one or more of the following in any of a variety of combinations. The second seed crystal may have been a portion of the first single-crystal AlN boule. The second seed crystal may have been or may be separated from the first single-crystal AlN boule. A maximum diameter of the first boule may not exceed a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm. A minimum diameter of the second boule may be no less than the transition diameter.

A minimum diameter of the second boule may be at least equal to a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm.

The first diameter may not exceed a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm. The second diameter may be no less than the transition diameter.

The second diameter may be at least equal to a transition diameter. The transition diameter may range from approximately 10 mm to approximately 40 mm, from approximately 10 mm to approximately 15 mm, from approximately 10 mm to approximately 20 mm, from approximately 10 mm to approximately 30 mm, from approximately 20 mm to approximately 40 mm, from approximately 20 mm to approximately 30 mm, from approximately 25 mm to approximately 40 mm, from approximately 30 mm to approximately 40 mm, or may be less than approximately 40 mm, less than approximately 35 mm, less than approximately 30 mm, less than approximately 25 mm, less than approximately 20 mm, or less than approximately 15 mm. The transition diameter may be at least 5 mm, at least 6 mm, at least 7 mm, at least 8 mm, at least 9 mm, or at least 10 mm.

A lateral surface of the first boule may be substantially free of planar facets (e.g., facets defining planes substantially parallel to the axial direction of the boule). A lateral surface of the second boule may be substantially free of planar facets (e.g., facets defining planes substantially parallel to the axial direction of the boule). A lateral surface of the first boule may be substantially free of polycrystalline material (e.g., polycrystalline AlN). A lateral surface of the second boule may be substantially free of polycrystalline material (e.g., polycrystalline AlN).

The axial length of the first boule may range from approximately 10 mm to approximately 25 mm, from approximately 10 mm to approximately 20 mm, from approximately 10 mm to approximately 15 mm, from approximately 15 mm to approximately 25 mm, or from approximately 15 mm to approximately 20 mm. The axial length of the second boule may range from approximately 20 mm to approximately 50 mm, from approximately 25 mm to approximately 50 mm, from approximately 30 mm to approximately 50 mm, or from approximately 25 to approximately 35 mm. The axial length of the second boule may be greater than the axial length of the first boule.

A concentration of carbon and/or oxygen within at least a portion of the first boule, within substantially the entire first boule, or within the entire first boule may be (e.g., for each of carbon and oxygen or collectively) at least approximately $10^{19}$ cm$^{-3}$, at least approximately $10^{20}$ cm$^{-3}$, or at least approximately $10^{21}$ cm$^{-3}$. A concentration of carbon and/or oxygen within at least a portion of the first boule, within substantially the entire first boule, or within the entire first boule may be (e.g., for each of carbon and oxygen or collectively) at most approximately $10^{22}$ cm$^{-3}$ or at most approximately $10^{21}$ cm$^{-3}$. A concentration of carbon and/or oxygen within at least a portion of the second boule, within substantially the entire second boule, or within the entire second boule may be (e.g., for each of carbon and oxygen or collectively) at most approximately $5 \times 10^{18}$ cm$^{-3}$, at most approximately $10^{18}$ cm$^{-3}$, at most approximately $5 \times 10^{17}$ cm$^{-3}$, or at most approximately $10^{17}$ cm$^{-3}$. A concentration of carbon and/or oxygen within at least a portion of the second boule, within substantially the entire second boule, or within the entire second boule may be (e.g., for each of carbon and oxygen or collectively) at least approximately $10^{14}$ cm$^{-3}$, at least approximately $10^{15}$ cm$^{-3}$, or at least approximately $10^{16}$ cm$^{-3}$. A concentration of carbon and/or oxygen within at least a portion of the second seed crystal, within substantially the entire second seed crystal, or within the entire second seed crystal may be (e.g., for each of carbon and oxygen or collectively) at least approximately $10^{19}$ cm$^{-3}$, at least approximately $10^{20}$ cm$^{-3}$, or at least approximately $10^{21}$ cm$^{-3}$. A concentration of carbon and/or oxygen within at least a portion of the second seed crystal, within substantially the entire second seed crystal, or within the entire second seed crystal may be (e.g., for each of carbon and oxygen or collectively) at most approximately $10^{22}$ cm$^{-3}$ or at most approximately $10^{21}$ cm$^{-3}$. A concentration of carbon and/or oxygen within the second boule may be less than A concentration of carbon and/or oxygen within the second seed crystal. A concentration of carbon and/or oxygen within at least a portion of the second boule may decrease along the axial length of the second boule in a direction away from the second seed crystal. A concentration of carbon and/or oxygen within a first portion of the second boule adjoining the second seed crystal may be larger than a concentration of carbon and/or oxygen within a second portion of the second boule farther away from the second seed crystal than the first portion. A concentration of carbon and/or oxygen within the first portion of the second boule may decrease within increasing distance away from the second seed crystal.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean ±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
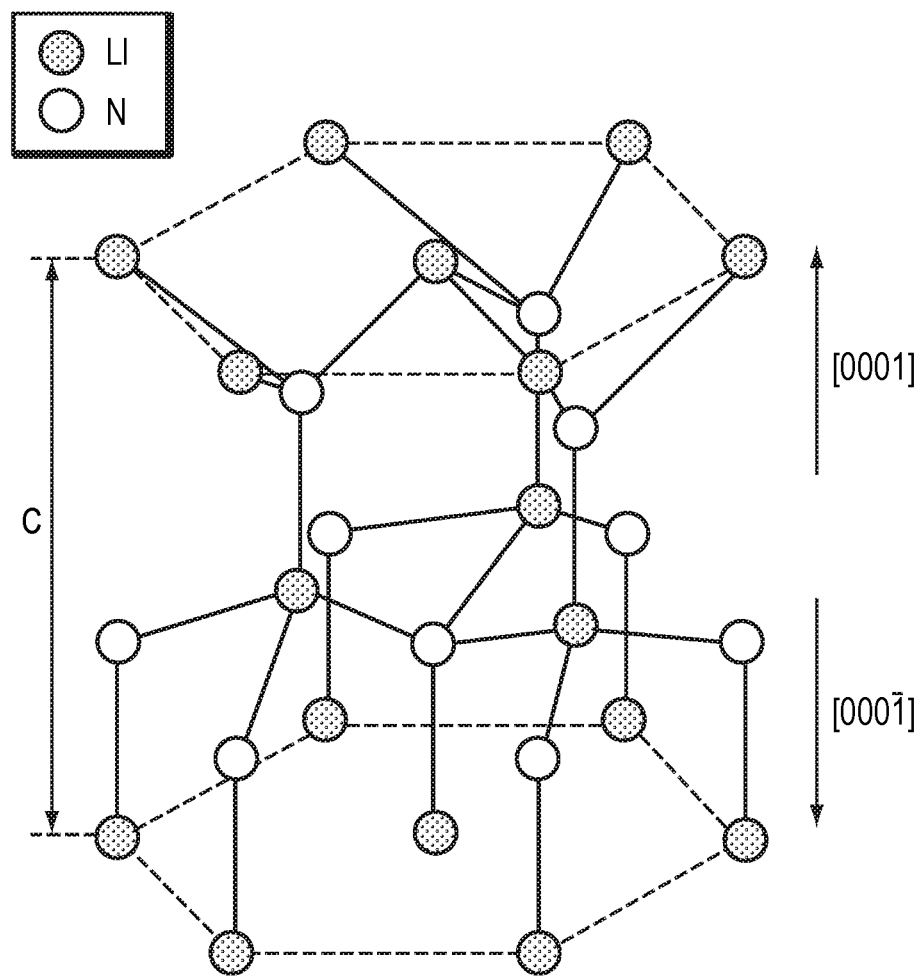
FIG. 1A is a schematic of an AlN unit cell.

FIG. 1A is a simple schematic of the AlN unit cell, in which the two crystallographic directions [0001] and [000$\bar{1}$] corresponding to +c (i.e., Al-polar) and −c (i.e., N-polar) orientations are also indicated. According to common convention, and as utilized herein, the Al face or Al-polarity face corresponds to the (0001) plane, while the N face or N-polarity face corresponds to the (000$\bar{1}$) plane. As shown in FIG. 1A, both the Al and N faces may each be Al-terminated or N-terminated. However, likely due to lower formation energies, the Al-terminated (0001) surface and the N-terminated (000$\bar{1}$) surface tend to be more stable, and this arrangement is assumed in the present disclosure.

Figure 1B:
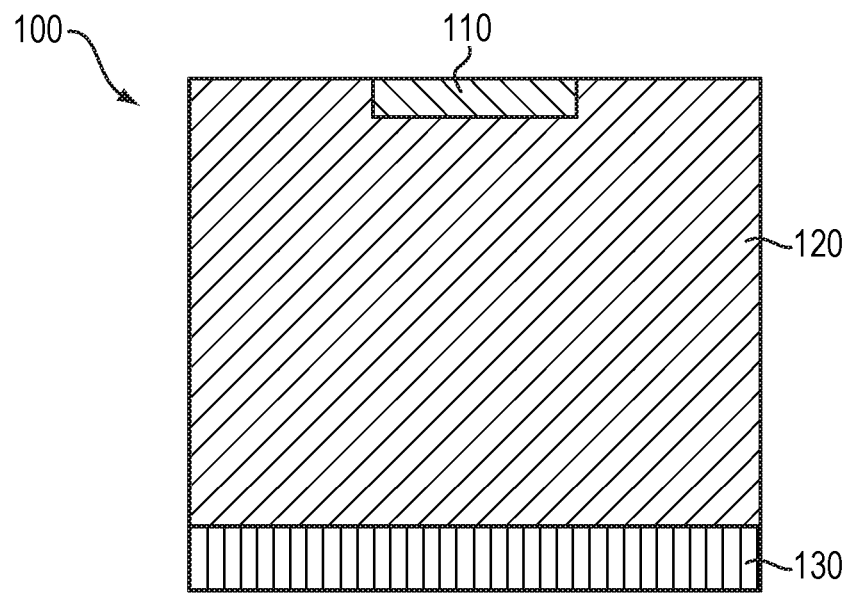
FIG. 1B is a schematic cross-section of a crystal-growth chamber utilized for crystal growth in accordance with various embodiments of the invention.

FIG. 1B is a cross-sectional view of a crystal-growth apparatus 100 in accordance with various embodiments of the present invention. As shown, apparatus 100 contains therewithin a first AlN seed (or "seed," or "seed crystal") 110 mounted within a crystal-growth chamber 120. AlN source material 130 may be disposed within and at the bottom of the growth chamber 120. For example, the source material 130 may include, consist essentially of, or consist of high-purity AlN polycrystalline ceramic. (In other embodiments of the invention, gaseous vapor may be pumped into the growth chamber 120 and utilized directly as source material.) For example, the source material 130 may include, consist essentially of, or consist of AlN polycrystalline ceramic fabricated in accordance with U.S. Pat. No. 8,012,257, filed on Mar. 30, 2007, or U.S. Pat. No. 9,034,103, filed on Jun. 30, 2010, the entire disclosure of each of which is incorporated by reference herein.

The crystal-growth furnace that typically surrounds the growth chamber 120 is not shown in FIG. 1B. Examples of such details may be found in the '346 patent. In various embodiments, the furnace may include a radio-frequency (RF) heating coil, and the growth chamber (or "crucible") 120 moves vertically relative to the heating coil (i.e., either the growth chamber 120 or the heating coil, or both, may move) in order to help form and maintain an axial thermal gradient along the direction of crystal growth from the first seed 110. The first seed 110 may include, consist essentially of, or consist of a single-crystal AlN plate and has an exposed face having an N-polarity facing the source material 130. Seed 110 may have any of a variety of cross-sectional shapes; in various embodiments, the cross-sectional shape of the seed crystal 110 is approximately the same as that of the growth chamber 120, e.g., circular.

The first seed 110 may be produced by any of several suitable techniques, for example techniques described in U.S. Pat. No. 6,719,843, filed on Sep. 20, 2002 (the '843 patent), and U.S. Pat. No. 8,123,859, filed on Jul. 22, 2010 (the '859 patent), the entire disclosure of each of which is incorporated herein by reference. For example, an AlN single crystal may be grown seedlessly (or "unseeded," e.g., within the conical tip of a crystal-growth crucible, which localizes the preferred nucleation point for the crystal), and the first seed 110 may be sliced or cut from the crystal with the desired orientation and shape. Alternatively, the first seed 110 may be produced by spontaneous nucleation of AlN within a growth crucible or apparatus, as described in C. Hartmann, et al., "Bulk AlN growth by physical vapour transport," Semicond. Sci. Technol. Vol. 29, 084002 (2014), the entire disclosure of which is incorporated by reference herein, followed by slicing of a seed crystal having the desired orientation and shape. The thickness of the first seed 110 may range from, for example, approximately 0.2 mm to approximately 2 mm.

The crucible 120 may include, consist essentially of, or consist of one or more refractory materials, such as W, rhenium (Re), and/or tantalum nitride (TaN). As described in the '135 patent and the '153 patent, the crucible 120 may have one or more surfaces (e.g., walls) configured to selectively permit the diffusion of N therethrough and selectively prevent the diffusion of Al therethrough. In some embodiments, the apparatus 100 for growth of single-crystal AlN boules includes a crucible 120 such as the one disclosed in the '843 patent, consisting essentially of W and fabricated by a CVD process. Multiple grain layers within the wall of the crucible may be obtained by interrupting the W deposition several times before the final wall thickness is obtained. Other crucible materials may be used, such as W—Re alloys; Re; tantalum monocarbide (TaC); a mixture of $Ta_2C$ and TaC; a mixture of $Ta_2C$, TaC and Ta; $Ta_2N$); a mixture of Ta and $Ta_2N$; hafnium nitride (HfN); a mixture of Hf and HfN; a mixture of W and Ta; W; and combinations thereof.

In various embodiments of the invention, the crucible 120 is placed into a furnace (e.g., an inductively heated furnace) so that the temperature gradient between the source material 130 and the seed 110 drives vapor to move from the hotter high-purity AlN ceramic source to the cooler seed crystal 110. The temperature at the seed interface and the temperature gradients may be monitored and carefully adjusted, if necessary, in order to nucleate high-quality monocrystalline material on the seed 110 and not destroy the AlN seed 110. The single-crystalline AlN material may be formed at temperatures of, e.g., greater than about 2000° C. The axial and/or radial thermal gradients within the crucible 120 may be controlled via any of a variety of techniques, e.g., via the arrangement of thermal shields outside of the crucible 120, as detailed in the '612 patent.

The diameter (or other lateral dimension) of the first seed 110 may be relatively small to enable more effective suppression of parasitic nucleation events at the edges of the growing crystal. For example, the diameter of the seed 110 may range from approximately 5 mm to approximately 20 nm. As shown in FIG. 1C, during the first stage of crystal growth, an AlN single crystal 140 nucleates and grows from the exposed N-polarity face of the seed 110. As shown, the diameter (or other lateral dimension) of the crystal 140 expands beyond that of the seed 110, during at least a portion of the growth of the crystal 140, via imposition of a radial thermal gradient within the crucible 120. As detailed herein, in general, increasing the radial thermal gradient increases the growth rate of a growing crystal in the radial (or "lateral") direction and thus increases the rate of diameter expansion of the crystal due to the larger lateral growth component.

In addition, as described in U.S. Pat. No. 9,034,103, dopants such as Si, O, and/or C may be incorporated within the source material 130 for the growth of crystal 140 and may thus be incorporated within the crystal 140 as it is formed. The present inventors have discovered that incorporation of such dopants may advantageously reduce the amount of parasitic edge nucleation during growth on the seed 110. Incorporation of the dopant(s) into the crystal 140 may result in reduced UV transparency of crystal 140 and seed crystals formed therefrom; however, lesser optical performance of such seeds may be acceptable since the seeds are merely utilized to form even larger crystals in the second growth stage. In various embodiments, the concentration of one or more dopants (e.g., Si, O, C) within the source material 130 and/or within the crystal 140 after formation is at least approximately $10^{19}$ $cm^{-3}$. In various embodiments, the concentration of the one or more dopants is limited to approximately $10^{21}$ $cm^{-3}$ or less, e.g., to prevent deleterious segregation in crystal 140.

Once the diameter of the crystal 140 reaches a transition diameter, the first stage of crystal growth is halted, and the apparatus 100 and the various elements therewithin are cooled down to approximately room temperature. In various embodiments of the invention, the transition diameter ranges from approximately 10 mm to approximately 40 nm, from approximately 10 mm to approximately 35 mm, from approximately 10 mm to approximately 30 mm, from approximately 10 mm to approximately 25 mm, from approximately 25 mm to approximately 40 mm, or from approximately 25 mm to approximately 35 mm. In various embodiments, the crystal 140 is cooled down to room temperature at a relatively high rate, e.g., approximately 300° C./hour or faster, for at least the initial stage of cooling from the growth temperature. In various embodiments, the cooling of crystal 140 is not "controlled," i.e., not slowed via application of heat from the furnace surrounding the crucible 120. In various embodiments, the rapid cooling of crystal 140 results in reduced UV transparency of crystal 140 and seed crystals formed therefrom; however, lesser optical performance of such seeds may be acceptable since the seeds are merely utilized to form even larger crystals in the second growth stage. For example, rapid cooling may result in increased concentrations of point defects and concomitant decreases in UV transparency, as described in U.S. Pat. No. 9,034,103.

The growth of the crystal 140 typically proceeds due to a relatively large axial thermal gradient (e.g., ranging from approximately 5° C./cm to approximately 100° C./cm) formed within the growth chamber 120. A heating apparatus (not shown for clarity), e.g., an RF heater, one or more heating coils, and/or other heating elements or furnaces, heats the growth chamber 120 to an elevated temperature typically ranging between approximately 1800° C. and approximately 2300° C. The apparatus 100 may feature one or more sets of thermal shields disposed above and/or below the growth chamber 120, arranged to create the large axial thermal gradient (by, e.g., better insulating the bottom end of growth chamber 120 and the source material 130 from heat loss than the top end of growth chamber 120 and the growing crystal 140), as detailed in the '612 patent. During the growth process, the growth chamber 120 may be translated within the heating zone created by the heating apparatus (or, equivalently, the heating apparatus itself may be translated relative to the growth chamber 120) via a drive mechanism in order to maintain the axial thermal gradient near the surface of the growing crystal 140.

In various embodiments, for example if the crystal 140 has not achieved the desired transition diameter during the growth process, the crystal 140 may be removed from the growth chamber and sectioned to form a new seed 110 having a larger diameter and an N-polarity surface, and the above-described growth process may be repeated. The growth process may be repeated one or more times until a crystal 140 having a diameter no less than the desired transition diameter is grown. In various embodiments, the length of crystal 140 is limited by the inner dimensions of growth chamber 120, allowing for the presence of source material 130. That is, in embodiments of the invention the growth of crystal 140 is halted before the crystal 140 grows to a length sufficient to contact any remaining source material 130 within the growth chamber 120. In exemplary embodiments, the length of crystal 140 ranges from approximately 10 mm to approximately 25 mm, from approximately 10 mm to approximately 20 mm, from approximately 10 mm to approximately 15 mm, or from approximately 15 mm to approximately 20 mm.

The radial thermal gradient during the growth process of crystal 140 on seed 110 may be kept relatively small (e.g., non-zero) to avoid the formation of large (1-100) facets (i.e., m-plane facets) that may easily form during N-polarity growth. For example, the radial thermal gradient during the growth on seed 110 may range from approximately 0.5° C./cm to approximately 5° C./cm, from approximately 0.5° C./cm to approximately 4° C./cm, from approximately 0.5° C./cm to approximately 3° C./cm, from approximately 1° C./cm to approximately 5° C./cm, from approximately 1° C./cm to approximately 4° C./cm, or from approximately 1° C./cm to approximately 3° C./cm. Utilization of larger radial gradients (to, e.g., expand the diameter of crystal 140 more quickly) may result in defect formation in crystal 140 (due to, e.g., excessive supersaturation of the gaseous growth precursor species over the (000-1) facet). Thus, diameter expansion of crystal 140 may be relatively slow as a function of the amount of axial growth in order to maintain high crystal quality. As also detailed in the '612 patent, the radial thermal gradient within the growth chamber 120 may be controlled via, e.g., selection of thickness, spacing, and/or opening size of one or more thermal shields arranged around (e.g., above and/or below) the growth chamber 120.

In various embodiments of the invention, the axial growth rate of crystal 140 is limited due to difficulties related to maintaining a large axial thermal gradient in conjunction with a low radial thermal gradient. That is, the axial thermal gradient and the resulting axial growth rate may be limited in order to maintain the low radial thermal gradient. In various embodiments, the axial growth rate of the crystal 140 ranges from approximately 0.1 mm/h to approximately 0.5 mm/h, from approximately 0.1 mm/h to approximately 0.4 mm/h, from approximately 0.1 mm/h to approximately 0.3 mm/h, from approximately 0.2 mm/h to approximately 0.4 mm/h, or from approximately 0.2 mm/h to approximately 0.3 mm/h. In various embodiments of the invention, the axial growth rate of crystals grown as detailed herein may be controlled via, e.g., selection of the initial starting position of the growth chamber 120 with respect to the heating coil disposed outside of the growth chamber 120, use of higher power to the heating coil (and therefore higher growth temperature) to increase the growth rate, selecting a smaller distance between the seed crystal and the source material to increase the growth rate, and increasing the axial thermal gradient (e.g., via selection and arrangement of thermal shields outside of the growth chamber 120).

In various embodiments, the rate of diameter expansion during growth on the first seed 110 and the transition diameter at which the growth is concluded are limited in order to prevent or substantially minimize parasitic nucleation and facet formation at the edges of crystal 140. Applicants have discovered that application of larger radial thermal gradients during growth on N-polarity seeds such as first seed 110 may result in strong competition of crystal nuclei of different orientations at the edges of the growing crystal, and this phenomenon results in parasitic nucleation and formation of crystal regions having different domains and crystalline textures. Limiting the rate of diameter expansion results in time-consuming, uneconomical growth processes. In addition, Applicants have discovered that limiting the diameter expansion via minimization of the radial thermal gradient during crystal growth may result in the formation of slow-growing growth facets within the crystal, and the growing crystal may transition from substantially circular to hexagonal in cross-section.

Figure 1E:
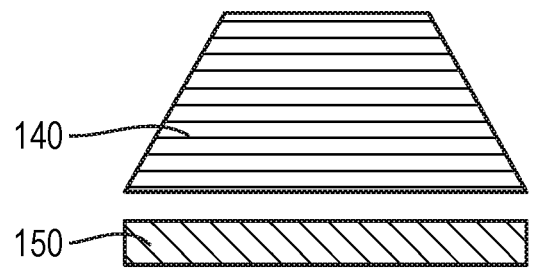
FIG. 1E is a schematic cross-section of a seed crystal separated from the boule illustrated in FIG. 1C in accordance with various embodiments of the invention.
Figure 1C:
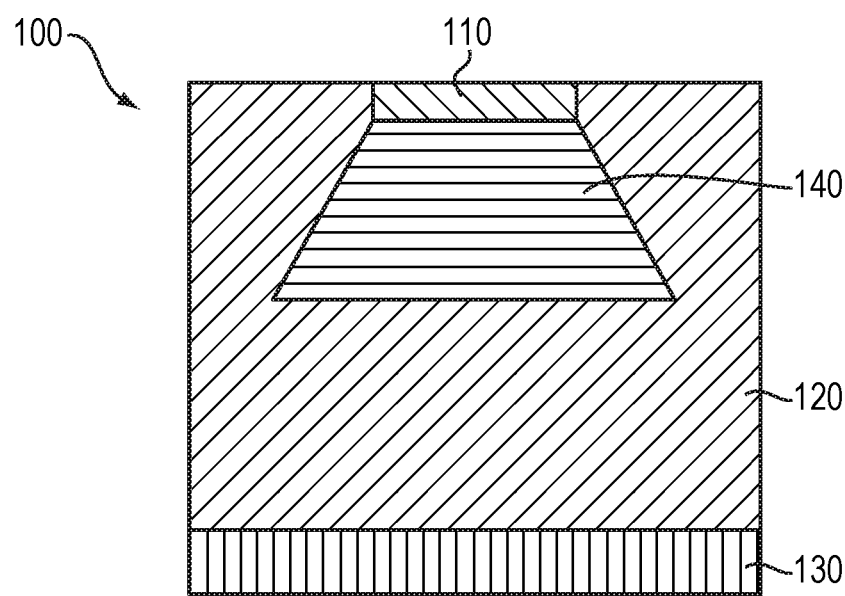
FIG. 1C depicts the crystal-growth chamber of FIG. 1B after growth of a single-crystalline boule controlled to induce diameter expansion of the boule in accordance with various embodiments of the invention.
Figure 1D:
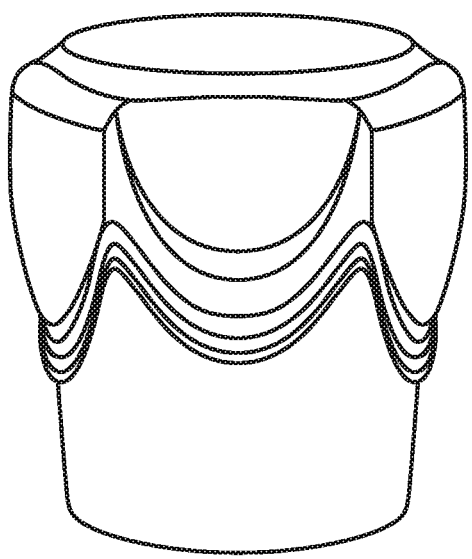
FIG. 1D is a photograph of an exemplary AlN crystal grown on an N-polarity seed crystal to a diameter past the transition diameter, whereupon edge facets have formed in the crystal.

FIG. 1D is a photograph of an AlN single-crystal boule grown on an N-polarity seed crystal in which large m-plane $\{1\bar{1}00\}$ facets have developed during the latter stages of growth, transitioning the crystal to a hexagonal cross-sectional shape. (In FIG. 1D, the boule has been flipped from the orientation illustratively shown in FIG. 1C, and the original seed crystal is at the bottom.) Various embodiments of the present invention limit N-polarity growth to form crystals 140 substantially free of such facets, limit the rate of diameter expansion of growth on first seed 110, and limit the ultimate diameter of crystal 140 to the transition diameter in order to minimize or eliminate the opposing phenomena of parasitic nucleation and edge-facet formation in crystal 140. For example, diameter expansion of the crystal 140 may be limited to a value ranging from approximately 0.5 mm to approximately 2 mm for each iteration of growth on a first seed 110. In various embodiments, the diameter expansion during an iteration of N-polarity growth is limited to a value of less than or equal to approximately 2 mm for each 20 mm of axial growth of the crystal 140.

As shown in FIG. 1E, the crystal 140 may be removed from the growth chamber 120 and sectioned to produce a second AlN seed crystal 150 having an exposed c face having an Al polarity. For example, after being oriented at a specific crystallographic orientation (selected via, e.g., x-ray Laue diffraction techniques as known in the art), the crystal 140 may be cut with, e.g., a diamond saw, and any resulting surface roughness and/or damage may be reduced or substantially eliminated via a polishing and/or planarization process. For example, the seed 150 may be polished in accordance with processes detailed in U.S. Pat. No. 7,037,838, the entire disclosure of which is incorporated by reference herein. An exemplary method includes performing a chemical-mechanical planarization (CMP) step by applying an abrasive suspension in a solution consisting essentially of a hydroxide. Another exemplary method is a CMP process that includes polishing a substrate using a slurry including an abrasive suspension in a solution capable of modifying the surface material of the substrate and creating a finished surface suitable for epitaxial growth. The active solution chemically modifies the surface of the substrate, forming a compound softer than the underlying substrate material. The abrasive is selected to be harder than the newly created compound, but softer than the substrate material, so that it polishes away the newly formed layer, while leaving the native substrate surface pristine and highly polished. The thickness of the second seed 150 may range from, for example, approximately 0.2 mm to approximately 2 mm.

In the event that the crystal 140 has developed facets over a portion of its length, exhibits parasitic edge nucleation and/or associated defects (e.g., dislocations, domain formation, phase boundaries, etc.) at its edge over a portion of its length, or otherwise was grown beyond the desired transition diameter, such portions of the crystal 140 may be removed, and the new seed 150 may be separated from a substantially facet-free portion of the crystal 140 at a length of the crystal 140, measured from the seed 110, not exceeding the desired transition diameter.

Figure 2A:
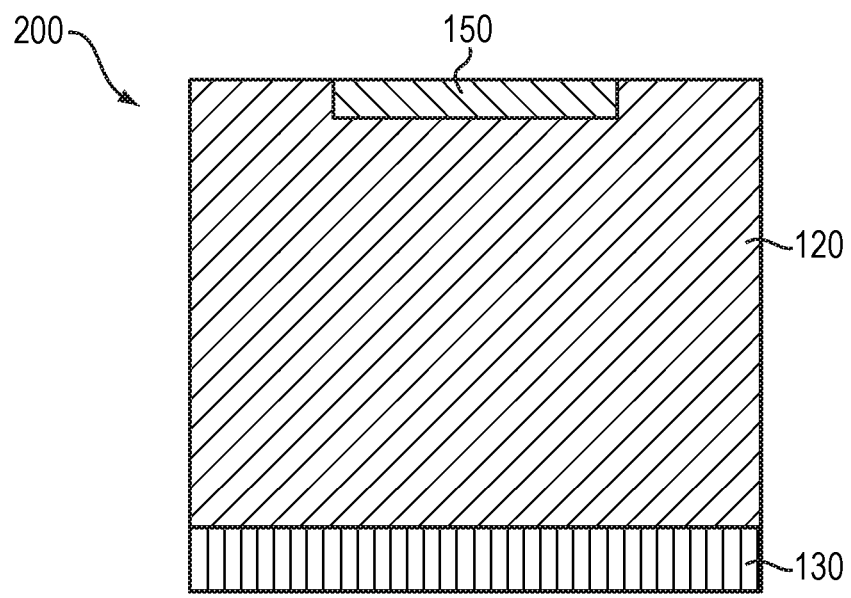
FIG. 2A is a schematic cross-section of a crystal-growth chamber utilized for crystal growth in accordance with various embodiments of the invention.

FIG. 2A depicts an exemplary crystal-growth apparatus 200 utilized for a second growth stage during formation of AlN single crystals with accordance of embodiments of the present invention. As shown, apparatus 200 features growth chamber 120 containing the second seed 150 and source material 130 therein. While growth chamber 120 may be utilized for both the first growth stage (i.e., growth utilizing the N-polarity seed 110) and the second growth stage (i.e., growth utilizing the Al-polarity seed 150), in embodiments of the invention different growth chambers may be utilized for each of the growth stages. For example, a smaller growth chamber may be utilized for the first growth stage, as the seed and the grown crystal are smaller. A smaller growth chamber may be more easily and rapidly heated and cooled, thereby enabling higher throughput. Smaller growth chambers may also facilitate the formation and maintenance of smaller radial thermal gradients within the growth chamber. In various embodiments, the diameter (or other lateral dimension) of the growth chamber utilized for growth on the N-polarity seed 110 may be limited to approximately the transition diameter selected for the crystal (e.g., approximately 2 mm, approximately 5 mm, or approximately 10 mm greater than the transition diameter), while the diameter (or other lateral dimension) of the growth chamber utilized for growth on the Al-polarity seed 150 may be larger (e.g., at least twice, or at least three times larger).

Figure 2B:
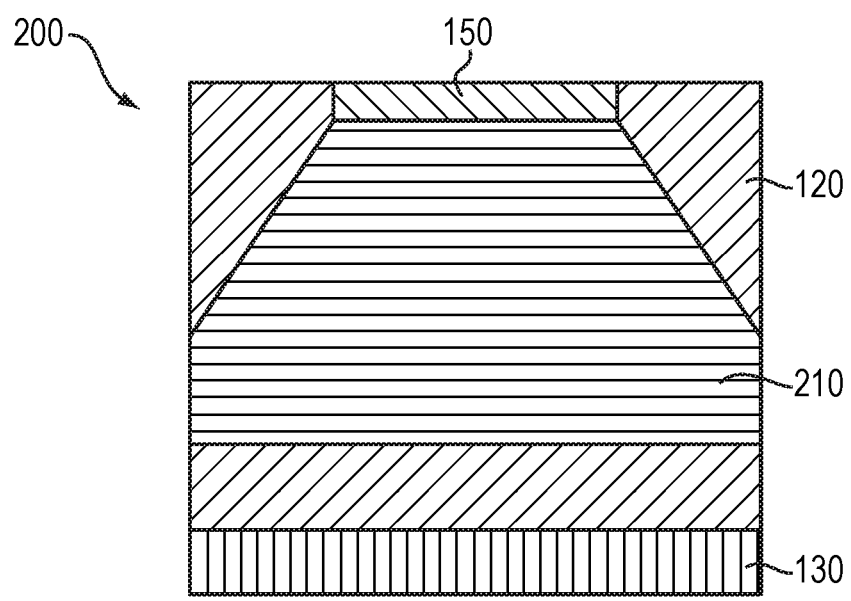
FIG. 2B depicts the crystal-growth chamber of FIG. 2A after growth of a single-crystalline boule controlled to induce diameter expansion of the boule in accordance with various embodiments of the invention.

In accordance with embodiments of the invention, crystal growth via PVT (e.g., sublimation-recondensation) is initiated using apparatus 200 in order to form on seed 150 an AlN single crystal 210, as shown in FIG. 2B. Because the seed 150 has an exposed c face having an Al polarity, the growth rate of the crystal 210 in the axial direction (i.e., toward the source material 130) may be increased to a rate faster than the growth rate utilized during the first growth stage. For example, the rate at which the growth chamber 120 is moved relative to the axial thermal gradient (formed via, e.g., arrangement of thermal shields relative to the growth chamber 120 and/or heating elements exterior to the growth chamber 120) may be faster than that utilized during the first growth stage while maintaining good crystal quality. In various embodiments of the invention, the axial growth rate of the crystal 210 may range from approximately 0.6 mm/h to approximately 1.5 mm/hr, from approximately 0.6 mm/h to approximately 1 mm/hr, from approximately 0.6 mm/h to approximately 0.8 mm/hr, from approximately 0.8 mm/h to approximately 1.5 mm/hr, or from approximately 0.8 mm/h to approximately 1 mm/hr.

In addition, because the seed 150 has a diameter of at least the transition diameter, parasitic nucleation at the edges of crystal 210 is suppressed or substantially eliminated. Due to the Al polarity of the seed 150, the radial thermal gradient during growth of crystal 210 may be increased to a level beyond that utilized during the growth of crystal 140 on seed 110. While the present inventors do not wish to be bound by any physical theory, growth on the seed 150 in the [0001] direction may proceed under larger radial thermal gradients (and thus larger resulting diameter expansion) due to the existence of relatively low energy facets between the (0001) facet and the m-plane facet (e.g., corresponding to {1-100} or {1-103} planes)—such facets may have surface energies close to the surface energy of the (0001) facet; thus, even under larger radial thermal gradients, the (0001) facet remains small and less defect introduction may occur due to supersaturation. In addition, perimeter portions of crystal 210 undergoing diameter expansion may not be subject to strong selective nucleation but will instead grow smoothly (relative to (0001) growth), resulting in high-quality material.

In various embodiments of the invention, the source material 130 is undoped (e.g., substantially free of dopants such as Si, O, and/or C) for the second stage of growth, and thus the crystal 210 may also be substantially free of such dopants. For example, the concentration of one or more dopants such as Si, O, and/or C within the source material 130 and the resulting crystal 210 may be less than approximately $10^{19}$ cm$^{-3}$, less than approximately $5\times10^{18}$ cm$^{-3}$, less than approximately $10^{18}$ cm$^{-3}$, less than approximately $5\times10^{17}$ cm$^{-3}$, or less than approximately $10^{17}$ cm$^{-3}$. In this manner, the crystal 210 and portions thereof (e.g., wafers therefrom) may exhibit advantageously high UV transparency.

While the lateral surface of portions of the crystal in FIG. 2B (as well as crystal 140 shown in FIGS. 1C and 1E) are depicted as straight and linear (in cross-section), this is not limiting, as the rate of diameter expansion during crystal growth may vary. Thus, embodiments of the present invention include crystal boules having lateral surfaces that are at least partially curved and/or at least partially composed of straight linear segments each forming a different angle with respect to the growth surface of the seed crystal (in cross section).

In various embodiments of the invention, the radial thermal gradient within the growth chamber 120 may be controlled to, e.g., reduce the possibility of parasitic nucleation at the edge of crystal 210 and/or to promote diameter expansion via, e.g., placement and configuration of one or more thermal shields as detailed in the '612 patent.

As shown in FIG. 2B and as discussed above, the diameter of crystal 210 may also expand during growth via, e.g., control of (e.g., increasing) the radial thermal gradient within the growth chamber 120. In various embodiments, the diameter of crystal 210 may expand to be approximately equal to the inner diameter of growth chamber 120. That is, the diameter of crystal 210 may expand until the crystal 210 encounters the wall of growth chamber 120, at which time axial growth of crystal 210 may continue at a substantially constant lateral diameter. At such time, or when a desired final diameter of crystal 210 has been achieved by diameter expansion, the radial thermal gradient within the growth chamber 120 may be decreased (although typically not eliminated entirely).

In various embodiments, the final diameter of the crystal 210 may be at least approximately 2×, at least approximately 3×, at least approximately 4×, or at least approximately 5× the transition diameter, or even larger. For example, the final diameter of the crystal 210 may be at least 50 mm, at least 60 mm, at least 70 mm, at least 80 mm, at least 90 mm, or at least 100 mm.

In various embodiments, the length of crystal 210 is limited by the inner dimensions of growth chamber 120, allowing for the presence of source material 130. That is, in embodiments of the invention the growth of crystal 210 is halted before the crystal 210 grows to a length sufficient to contact any remaining source material 130 within the growth chamber 120. In various embodiments, the length of crystal 210 is greater than the as-grown length of the crystal 140. For example, the length of crystal 210 may range from approximately 20 mm to approximately 50 mm, from approximately 25 mm to approximately 50 mm, from approximately 30 mm to approximately 50 mm, or from approximately 25 to approximately 35 mm.

After formation of the crystal 210, crystal 210 may be segmented into multiple AlN single-crystal wafers (e.g., as detailed for crystal 140 above) for, e.g., fabrication of electronic and/or optoelectronic devices thereon. For example, portions of crystal 210 may be utilized as substrates for subsequent epitaxial growth and processing for the formation of light-emitting diodes (LEDs) and/or lasers that emit light in the ultraviolet wavelength range.

Figure 3A:
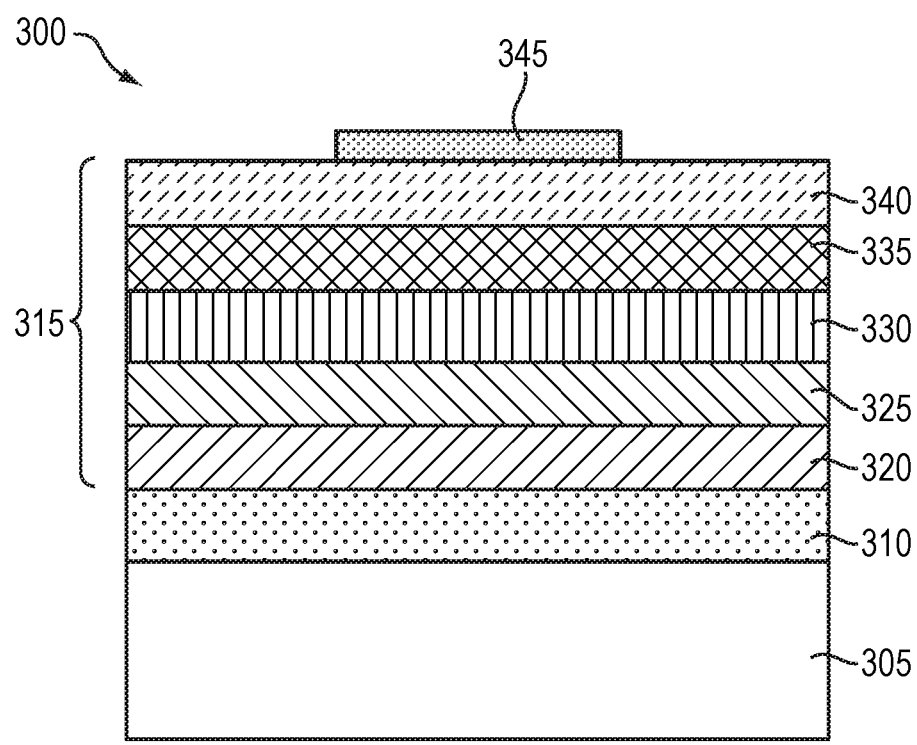
FIGS. 3A and 3B are schematic cross-sections of light-emitting devices in accordance with various embodiments of the invention.

FIG. 3A schematically depicts a light-emitting device structure 300 in accordance with embodiments of the present invention. Light-emitting device structures 300 in accordance with embodiments of the invention may include, consist essentially of, or consist of, for example, light-emitting diodes or lasers. As shown, the device structure 300 includes a substrate 305, which in various embodiments includes, consists essentially of, or consists of aluminum nitride, e.g., single-crystal aluminum nitride. In various embodiments, substrate 305 is a single-crystal substrate separated from crystal 210 after formation thereof. In various embodiments, the substrate 305 may not be transparent (at least not fully transparent) to radiation emitted by the device structure 300 (e.g., UV radiation). Substrate 305 may be miscut such that the angle between its c-axis and its surface normal is between approximately 0° and approximately 4°. In various embodiments, the misorientation of the surface of substrate 305 is less than approximately 0.3°, e.g., for substrates 305 that are not deliberately or controllably miscut. In other embodiments, the misorientation of the surface of substrate 305 is greater than approximately 0.3°, e.g., for substrates 305 that are deliberately and controllably miscut. In various embodiments, the direction of the miscut is towards the a-axis.

The surface of substrate 305 may have a group-III (e.g., Al—) polarity, and may be planarized, e.g., by chemical-mechanical polishing. The RMS surface roughness of substrate 305 may be less than approximately 0.5 nm for a 10 μm×10 μm area. In some embodiments, atomic-level steps are detectable on the surface when probed with an atomic-force microscope. The threading dislocation density of substrate 305 may be measured using, e.g., etch pit density measurements after a 5 minute KOH—NaOH eutectic etch at 450° C. In various embodiments, the threading dislocation density is less than approximately $2 \times 10^3$ $cm^{-2}$. In some embodiments substrate 305 has an even lower threading dislocation density. Substrate 305 may be topped with a homoepitaxial layer (not shown) that may include, consist essentially of, or consist of doped or undoped AlN.

The various layers of device structure 300 disposed over substrate 305 may be formed by any of a variety of different techniques, e.g., epitaxial growth techniques such as chemical vapor deposition (CVD) methods such as metallorganic CVD (MOCVD).

In accordance with embodiments of the invention, a release layer 310 may be disposed over the substrate 305 to facilitate later removal of all or a portion of the substrate 305 from the rest of device structure 300, for example as described in U.S. patent application Ser. No. 15/977,031, filed on May 11, 2018 (the '031 patent application), the entire disclosure of which is incorporated by reference herein. In various embodiments, the release layer 310 is substantially lattice-matched to the substrate 305. Minimizing the lattice mismatch between the release layer 310 and the substrate 305 advantageously reduces or eliminates, for example, cracking and/or defect introduction in the release layer 310 and island formation (i.e., three-dimensional growth) during growth of the release layer 310. (As used herein, a layer that is "substantially lattice-matched" to a substrate or another layer has an unstrained lattice parameter sufficiently close to that of the substrate or other layer to enable epitaxial growth of the layer thereover such that the layer is approximately lattice-relaxed, or tensilely or compressively strained without significant strain relaxation (e.g., less than 20% relaxation, or even less than 10% relaxation), and/or to enable epitaxial growth of the layer without introduction of cracks and/or defects (e.g., dislocations) at densities exceeding those, if any, present in the underlying substrate or layer.) In various embodiments, the lattice mismatch between the release layer 310 and the substrate 305 is less than ±5%, less than ±3%, less than ±2%, less than ±1%, less than ±0.5%, less than ±0.2%, or less than ±0.1%. In various embodiments, it may be preferable to reduce the lattice mismatch when the release layer 310 is tensilely strained (i.e., the unstrained, innate in-plane lattice spacing of the release layer 310 is smaller than that of substrate 305) in order to minimize or eliminate stress-relieving cracking in the release layer 310. In various embodiments, when the release layer 310 is compressively strained, the lattice mismatch to the substrate 305 may be larger but may be a function of the thickness of release layer 310. For example, compressively strained release layers 310 having too much lattice mismatch to the substrate 305 and too large a thickness may island during layer growth. Thus, in various embodiments, a release layer 310 having a compressive lattice mismatch with substrate 305 of approximately 3% may have a thickness no more than approximately 10 nm. For layers with less lattice mismatch, the thickness may be larger.

In various embodiments, the release layer 310 includes, consists essentially of, or consists of AlN or AlGaN doped with one or more impurities that form an absorption band within the release layer 310 for a wavelength of light not strongly absorbed by the substrate 305 itself. For example, the release layer 310 may include, consist essentially of, or consist of AlN doped with oxygen, which has an absorption band at approximately 310 nm. Since an AlN substrate 305 does not strongly absorb light having wavelengths larger than approximately 300 nm, absorption of light within, and concomitant local heating of, the release layer 310 may be utilized to remove the substrate 305 from the device structure 300. In various embodiments, the release layer 310 may be doped with oxygen (O) and/or one or more other dopants, for example, carbon (C), iron (Fe), manganese (Mn), or gadolinium (Gd). Such dopants may be introduced (e.g., as an additional gaseous species) during epitaxial growth of the release layer 310. In other embodiments, some or all of the dopant may be introduced after epitaxial growth of at least a portion of the release layer 310 by techniques such as ion implantation or dopant diffusion (e.g., from a solid or gaseous source). In various embodiments of the invention, one or more of the dopants may be introduced into and/or present within the release layer 310 at a concentration of at least for example, approximately $10^{17}$ $cm^{-3}$, at least approximately $10^{18}$ $cm^{-3}$, or even at least $10^{19}$ $cm^{-3}$. In various embodiments of the invention, one or more of the dopants may be introduced into and/or present within the release layer 310 at a concentration of at most for example, approximately $10^{20}$ $cm^{-3}$, or at most approximately $10^{21}$ $cm^{-3}$.

In exemplary embodiments, a release layer 310 including, consisting essentially, or consisting of AlN doped with oxygen may exhibit an absorption band at a wavelength of approximately 310 nm, and a release layer 310 including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, release layer 310 may include, consist essentially of, or consist of a semiconductor other than AlN (e.g., AlGaN), and which may contain one or more dopants forming one or more absorption bands for light that is not strongly absorbed by substrate 305. In various embodiments, the release layer 310 may include, consist essentially of, or consist of a nitride alloy containing one or more of boron, aluminum, gallium, and/or indium. The release layer 310 may even include, consist essentially of, or consist of silicon carbide or a metal nitride (in which the metal is, e.g., one or more of Sc, Y, La, Ti, or Ta). For example, a release layer 310 including, consisting essentially, or consisting of silicon carbide may exhibit an absorption band at a wavelength of approximately 376 nm, and a release layer 310 including, consisting essentially, or consisting of titanium nitride may exhibit an absorption band at a wavelength of approximately 365 nm. In various embodiments, the release layer 310 is substantially lattice-matched to substrate 305.

In various embodiments, multiple release layers 310 may be present within device structure 300, and each release layer 310 may have one or more absorption bands different from one or all absorption bands in the other release layer(s) 310. For example, multiple release layers 310 including, consisting essentially of, or consisting of AlN or AlGaN may be formed (e.g., epitaxially grown), where each release layer 310 is doped with a different one of the dopants referred to above. In various embodiments, one or more release layers 310 may be tensilely strained with respect to the substrate 305, and/or one or more release layers 310 may be compressively strained with respect to the substrate 305. In various embodiments of the invention, release layer 310 is not present within the device structure 300.

Device structure 300 also includes an active light-emitting structure 315 disposed over the release layer 310, if the release layer 310 is present, as shown in FIG. 3A. For example, the active structure 315 may include a bottom contact layer 320. In various embodiments, the bottom contact layer 320 is n-type doped, e.g., doped with an impurity such as P, As, Sb, C, H, F, O, Mg, and/or Si. The bottom contact layer 320 may include, consist essentially of, or consist of, for example, AlN or $Al_xGa_{1-x}N$. In an embodiment, an optional graded buffer layer (not shown) is disposed above substrate 305 and below bottom contact layer 320 (and, in various embodiments, below the release layer 310, if the release layer 310 is present). The graded buffer layer may include, consist essentially of, or consist of one or more semiconductor materials, e.g., $Al_xGa_{1-x}N$. In various embodiments, the graded buffer layer has a composition approximately equal to that of substrate 305 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 320 (or release layer 310, if present) may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x ranging from approximately 60% to approximately 85%.

The bottom contact layer 320 may have a thickness sufficient to prevent current crowding after device fabrication and/or to stop on during etching to fabricate contacts. For example, the thickness of bottom contact layer 320 may range from approximately 100 nm to approximately 500 nm, or from approximately 100 nm to approximately 2 µm. When utilizing a bottom contact layer 320, the final light-emitting device may be fabricated with back-side contacts. In various embodiments, bottom contact layer 320 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 315 is configured for the emission of light in response to an applied voltage. Thus, the active structure 315 may include a multiple-quantum well ("MQW") layer 325 disposed above bottom contact layer 320. In various embodiments, MQW layer 325 is disposed directly on the bottom contact layer 320. In other embodiments, an optional layer (e.g., an undoped layer including, consisting essentially of, or consisting of an undoped semiconductor material such as AlGaN) may be disposed between the bottom contact layer 320 and the MQW layer 325. The MQW layer 325 may be doped with the same doping polarity as the bottom contact layer 320, e.g., n-type doped. The MQW layer 325 may include, consist essentially of, or consist of one or more quantum wells separated by (or surrounded on both sides by) barriers. For example, each period of MQW layer 325 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 325 may include a plurality of such periods, and may have a total thickness ranging from 20 nm to 100 nm, or less than approximately 50 nm. In various embodiments of the invention, the active light-emitting structure 315 is configured to (e.g., has a MQW layer 325 having layer composition(s) selected to) emit ultraviolet light.

In various embodiments of the invention, an electron-blocking layer 330 may be disposed over MQW layer 325. The electron-blocking layer 330 typically has a wider band gap than that of a band gap within the MQW layer 325 (e.g., a band gap of the barrier layers therewithin). In various embodiments, the electron-blocking layer 330 may include, consist essentially of, or consist of e.g., $Al_xGa_{1-x}N$, and electron-blocking layer 330 may be doped. For example, the electron-blocking layer 330 may be doped with the same doping polarity as that of bottom contact layer 320 and/or MQW layer 325 (e.g., n-type doped). In various embodiments, the value of x in the electron-blocking layer 330 is greater than the value of the Al mole fraction in the barrier layers used in the MQW layer 325. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 330 may have a thickness that may range, for example, between approximately 10 nm and approximately 50 nm, or even between approximately 10 nm and approximately 30 nm. In various embodiments of the invention, the electron-blocking layer 330 is sufficiently thin (e.g., thickness less than about 30 nm, or less than about 20 nm) so as to facilitate carrier (e.g., hole) tunneling through the electron-blocking layer 330. In various embodiments of the invention, the electron-blocking layer 330 is omitted from device structure 300.

As shown in FIG. 3A, device structure 300 may also include a graded layer 335 disposed above the electron-blocking layer 330 (or above the MQW layer 325 in embodiments in which electron-blocking layer 330 is omitted), and a cap layer (or "top contact layer") 340 may be disposed over the graded layer 335. The cap layer 340 may be doped with a doping polarity opposite of that of the bottom contact layer 320, e.g., p-type doped with one or more dopants such as Mg, Be, and/or Zn. In other embodiments, the cap layer 340 may be undoped, as carriers (e.g., holes) may be injected from an electrode into a two-dimensional carrier gas disposed at the interface between the cap layer 340 and the graded layer 335. (While in exemplary embodiments described herein the cap layer 340 is doped p-type and the bottom contact layer 320 is doped n-type, embodiments in which the doping polarities of these layers are switched are within the scope of the present invention; in such embodiments, the electron-blocking layer 330, if present, may be considered to be a "hole-blocking layer," as understood by those of skill in the art.) The cap layer 340 may have a thickness ranging from, e.g., approximately 1 nm to approximately 100 nm, or approximately 1 nm to approximately 50 nm, or approximately 1 nm to approximately 20 nm. In various embodiments, the cap layer 340 includes, consists essentially of, or consists of $Al_xGa_{1-x}N$, and in various embodiments the aluminum concentration x may range from 0 (i.e., pure GaN) to approximately 0.2.

The device structure 300 may also incorporate one or more metallic contacts to facilitate electrical contact to the device. For example, one metallic contact may include or consist essentially of an electrode layer 345 disposed above or on the cap layer 340. The composition and/or shape of the electrode layer 345 are not particularly limited as long as it enables the injection of carriers (e.g., holes) into the cap layer 340. In embodiments in which holes are injected into a p-type doped nitride-based semiconductor cap layer 340, the electrode layer 345 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 340, the electrode layer 345 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 345 in accordance with embodiments of the invention are not limited to these materials. The thickness of the electrode layer 345 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 345 is formed after removal of all or a portion of the substrate 305.

Figure 3B:
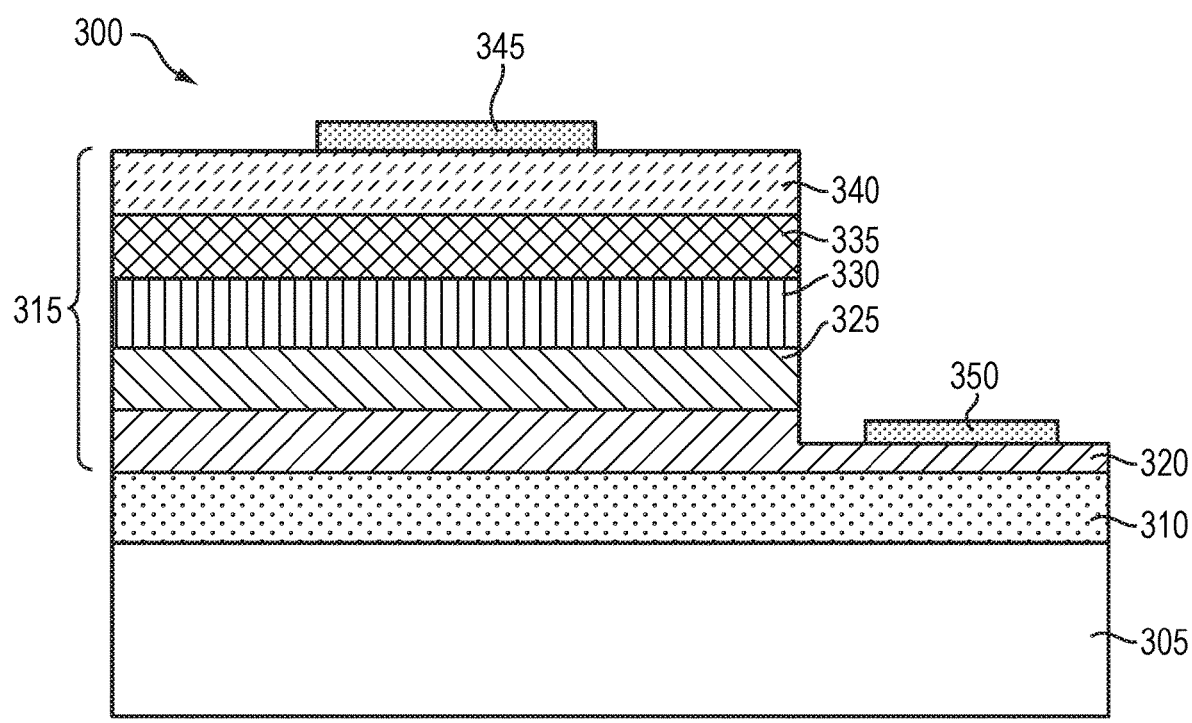

In various embodiments, a second electrode layer 350 may be formed in electrical contact with (and, in various embodiments, direct mechanical contact with) the bottom contact layer 320, even if the substrate 305 is not removed, as shown in FIG. 3B; such an electrode layer 350 may be considered to be a "bottom electrode layer." For example, a portion of the active structure 315 may be removed by, e.g., conventional photolithography and wet and/or dry etching, in order to reveal at least a portion of the bottom contact layer 320. The second electrode layer 350 may then be deposited on the bottom contact layer. The composition and/or shape of the bottom electrode layer 350 are not particularly limited as long as it enables the injection of carriers (e.g., electrons) into the bottom contact layer 320. In embodiments in which electrons are injected into an n-type doped nitride-based semiconductor bottom contact layer 320, the bottom electrode layer 350 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 320, the bottom electrode layer 350 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 350 in accordance with embodiments of the invention are not limited to these materials. The thickness of the bottom electrode layer 350 may be, for example, between approximately 10 nm and approximately 100 nm, or between approximately 10 nm and approximately 50 nm, or between approximately 10 nm and approximately 30 nm, or between approximately 25 nm and approximately 40 nm.

As mentioned above, embodiments of the present invention feature a graded layer 335 disposed between the cap layer 340 and the electron-blocking layer 330 (or the MQW layer 315 in embodiments in which the electron-blocking layer 330 is omitted). The graded layer 335 typically includes, consists essentially of, or consists of a nitride semiconductor, e.g., a mixture or alloy of Ga, In, and/or Al with N. The compositional gradient within graded layer 335 may be substantially continuous or stepped, and the grading rate within the graded layer 335 may be substantially constant or may change one or more times within the thickness of graded layer 335. The graded layer 335 may be undoped. In other embodiments, the graded layer 335 is doped n-type or p-type with one or more dopants, e.g., C, H, F, O, Mg, Be, Zn, and/or Si. The thickness of the graded layer 335 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 300 may be temporarily halted between growth of the graded layer 335 and the underlying layer and/or the overlying layer. In various embodiments, the graded layer 335 is pseudomorphically strained to one or more of the underlying layers and/or to the substrate 305.

In various embodiments of the invention, one or more (or even all) of the layers of device structure 300 formed over substrate 305 may be pseudomorphically strained, similar to device layers described in U.S. Pat. No. 9,437,430, filed on Jan. 25, 2008, U.S. Pat. No. 8,080,833, filed on Apr. 21, 2010, and U.S. Pat. No. 9,299,880, filed on Mar. 13, 2014, the entire disclosure of each of which is incorporated by reference herein. Thus, as detailed therein, in various embodiments, one or more of the layers of device structure 300 may be pseudomorphic and may have a thickness greater than its predicted (e.g., via the Maxwell-Blakeslee theory) critical thickness. Moreover, the collective layer structure of device structure 300 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 300 are pseudomorphically strained and cap layer 340 is partially or substantially fully relaxed. For example, the lattice mismatch between cap layer 340 and substrate 305 and/or MQW layer 335 may be greater than approximately 1%, greater than approximately 2%, or even greater than approximately 3%. In an exemplary embodiment, cap layer 340 includes, consists essentially of, or consists of undoped or doped GaN, substrate 305 includes, consists essentially of, or consists of doped or undoped single-crystalline AlN, and MQW layer 325 includes, consists essentially of, or consists of multiple $Al_{0.55}Ga_{0.45}N$ quantum wells interleaved with $Al_{0.75}Ga_{0.25}N$ barrier layers, and cap layer 340 is lattice mismatched by approximately 2.4%. Cap layer 340 may be substantially relaxed, i.e., may have a lattice parameter approximately equal to its theoretical unstrained lattice constant. A partially or substantially relaxed cap layer 340 may contain strain-relieving dislocations having segments threading to the surface of cap layer 340 (such dislocations may be termed "threading dislocations"). The threading dislocation density of a relaxed cap layer 340 may be larger than that of substrate 305 and/or layers underlying cap layer 340 by, e.g., one, two, or three orders of magnitude, or even more.

In accordance with embodiments of the present invention, application of light (e.g., laser light) and/or heat may be utilized to separate the substrate 305 from the rest of device structure 300, as detailed in the '031 patent application. Before such substrate separation, the device structure 300 may be attached to a handle wafer (not shown) by, for example, wafer bonding or an adhesive material. In various embodiments, the device structure 300 may be wafer bonded to the handle wafer via use of an intermediate material such as, for example, photoresist (e.g., SU-8), glass frit, an organic material such as benzocyclobutene (BCB), etc. Wafer bonding techniques, including reversible ones (i.e., techniques in which the handle wafer is straightforwardly removed after bonding and processing) are known to those of skill in the art and may be accomplished without undue experimentation. The handle wafer may be at least substantially transparent to light emitted by the active structure 315 and/or to light utilized to separate substrate 305 (e.g., via absorption within release layer 310). The handle wafer may include, consist essentially of, or consist of, for example, one or more semiconductor materials, sapphire, quartz, etc. For substrate separation, heat and/or light having a wavelength corresponding to an absorption band within release layer 310 (e.g., approximately 310 nm for oxygen-doped AlN) may be emitted into the device structure 300 (e.g., from below the substrate 105 and/or from one or more sides of the bonded structure). (As utilized herein, a wavelength "corresponding to" an absorption band is sufficiently close to the absorption band such that an amount of the light sufficient to effect at least partial release of an underlying substrate and/or layer is absorbable within the layer having the absorption band.) In various embodiments, the light is primarily composed of or contains a wavelength that is within ±20 nm, within ±10 nm, within ±5 nm, within ±2 nm, or within ±1 nm of the wavelength of an absorption band within the release layer 310. In various embodiments, the release layer 310 may have more than one absorption band (due to, e.g., introduction of two or more different dopants), and the light may be primarily composed of or contain one or more wavelengths that are within ±20 nm, within ±10 nm, within ±5 nm, within ±2 nm, or within ±1 nm of the wavelength of one or more of the absorption bands within the release layer 310. Absorption of the light and/or heat within the release layer 310 results in local heating within the release layer 310, which may be magnified for release layers 310 having lower thermal conductivity. The local heating results in crack formation and subsequent fracture within the release layer 310 and/or at the interface between release layer 310 and substrate 305, thereby removing the substrate 305 (or at least a portion thereof) from device structure 300. In various embodiments of the invention, the light may be applied at a fluence ranging from, for example, approximately 500 mJ/cm$^2$ to approximately 1000 mJ/cm$^2$. In various embodiments of the invention, the light may be applied as one or more pulses. Such pulses may have durations ranging from, for example, approximately 10 ms to approximately 100 ms.

In various embodiments, at least a portion of the release layer 310 remains attached to the device structure 300 upon removal of the substrate 305. After removal of the substrate 305, any remaining portion of the release layer 310 may be removed (e.g., by selective etching or grinding and/or polishing). A metallic contact may be formed in contact with the bottom contact layer 320, and the device structure 300 may be utilized to emit light without absorption thereof by substrate 305. The metallic contact may be formed on the "bottom" surface of the bottom contact layer 320 (i.e., the surface of the bottom contact layer 320 opposite the top contact layer), or a portion of the structure may be etched away so that the metallic contact may be formed on a thusly revealed "top" surface of the bottom contact layer (i.e., the surface of the bottom contact layer 320 opposite the prior location of substrate 305). In various embodiments, any handle wafer used in the substrate-separation process is removed from the device structure 300, while in other embodiments, the handle wafer remains attached to the device structure 300.

Figure 4A:
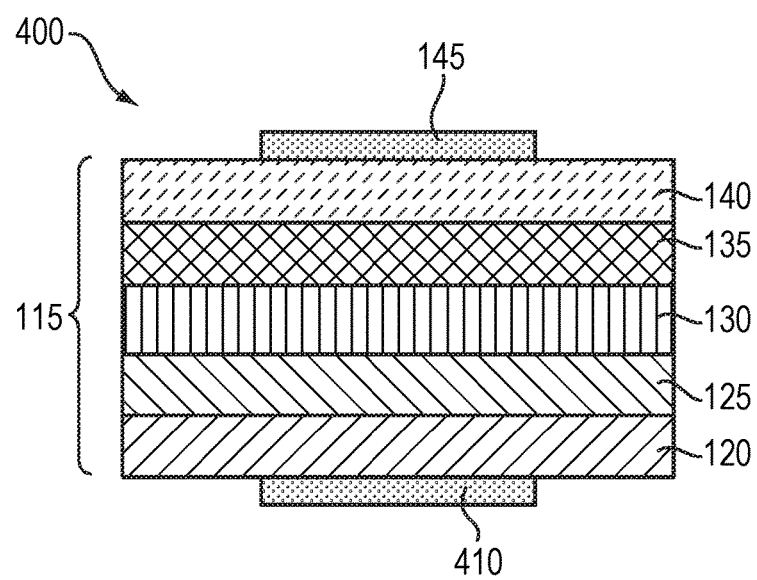
FIGS. 4A and 4B are schematic cross-sections of light-emitting devices after substrate removal in accordance with various embodiments of the invention.
Figure 4B:
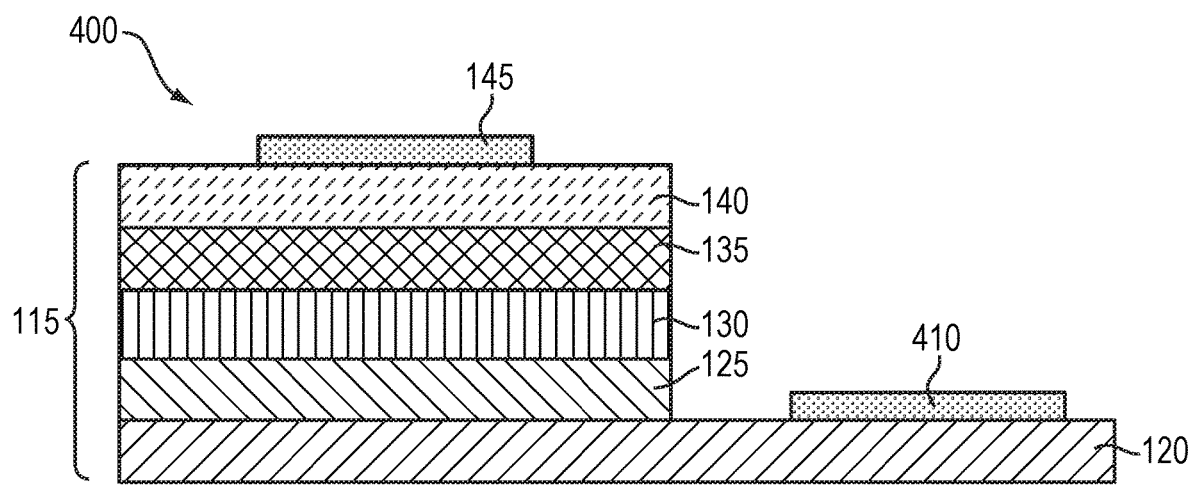

As mentioned, after removal of all or a portion of the substrate 305, electrical contacts may be made to the bottom contact layer 320 and the cap layer 340 so that power may be applied to the device structure 300, resulting in light emission therefrom. FIGS. 4A and 4B depict different device structures 400 in accordance with various embodiments, in which a bottom electrode layer 410 is formed below the newly exposed bottom contact layer 120 after removal of the substrate 305 (FIG. 4A) and on top of a portion of bottom contact layer 320 after removal of the substrate 305 and masking and removal of a portion of the active structure 315 (FIG. 4B). The composition and/or shape of the bottom electrode layer 410 are not particularly limited as long as it enables the injection of carriers (e.g., electrons) into the bottom contact layer 320. In embodiments in which electrons are injected into an n-type doped nitride-based semiconductor bottom contact layer 320, the bottom electrode layer 410 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 320, the bottom electrode layer 410 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 410 in accordance with embodiments of the invention are not limited to these materials. The thickness of the bottom electrode layer 410 may be, for example, between approximately 10 nm and approximately 100 nm, or between approximately 10 nm and approximately 50 nm, or between approximately 10 nm and approximately 30 nm, or between approximately 25 nm and approximately 40 nm.

After formation of the electrodes 345 and/or 410, the resulting light-emitting device may be electrically connected to a package, for example as detailed in U.S. Pat. No. 9,293,670, filed on Apr. 6, 2015 (the '670 patent), the entire disclosure of which is incorporated by reference herein. A lens may also be positioned on the device to transmit (and, in various embodiments, shape) the light emitted by the device. For example, a rigid lens may be disposed over the device as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any handle wafer remaining on the active structure 315 may be removed.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or the like techniques that some would refer to as "high-temperature CVD." Also, other terms are sometimes used to describe these and techniques that are used to grow bulk single AlN crystals in accordance with embodiments of the invention. Therefore, the terms "depositing," "growing," "depositing vapor species," and like terms are used herein to generally cover those techniques by which the crystal may be grown pursuant to embodiments of this invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming single-crystal aluminum nitride (AlN), the method comprising:
   (a) providing a first seed crystal comprising AlN;
   (b) within a first growth chamber, depositing single-crystal AlN on the first seed crystal;
   (c) during at least some of the deposition of single-crystal AlN on the first seed crystal, inducing diameter expansion such that at least a portion of the single-crystal AlN has a diameter greater than a diameter of the first seed crystal, the diameter expansion proceeding at a first expansion rate;
   (d) thereafter, separating a second seed crystal from the single-crystal AlN deposited on the first seed crystal, the second seed crystal comprising AlN and having a diameter greater than the diameter of the first seed crystal;
   (e) within a second growth chamber, depositing single-crystal AlN on the second seed crystal;
   (f) during at least some of the deposition of single-crystal AlN on the second seed crystal, inducing diameter expansion such that at least a portion of the single-crystal AlN has a diameter greater than a diameter of the second seed crystal, the diameter expansion proceeding at a second expansion rate larger than the first expansion rate.

2. The method of claim 1, wherein the first seed crystal has a growth face having an N polarity.

3. The method of claim 2, wherein the second seed crystal has a growth face having an Al polarity.

4. The method of claim 1, wherein the second seed crystal has a growth face having an Al polarity.

5. The method of claim 1, wherein the second seed crystal has a diameter ranging from approximately 10 mm to approximately 40 mm.

6. The method of claim 1, wherein the first expansion rate is at most approximately 2 mm for each 20 mm of axial growth of the single-crystal AlN.

7. The method of claim 6, wherein the second expansion rate is at least approximately 10 mm for each 20 mm of axial growth of the single-crystal AlN.

8. The method of claim 1, wherein the second expansion rate is at least approximately 10 mm for each 20 mm of axial growth of the single-crystal AlN.

9. The method of claim 1, wherein the first growth chamber is the same as the second growth chamber.

10. The method of claim 1, wherein the first growth chamber is different from the second growth chamber.

11. The method of claim 1, wherein, in step (c), the diameter of the at least a portion of the single-crystal AlN does not exceed a transition diameter ranging from approximately 10 mm to approximately 40 mm.

12. The method of claim 1, further comprising separating a single-crystal AlN substrate from the single-crystal AlN deposited on the second seed crystal; and
   forming a light-emitting device structure over the single-crystal AlN substrate to form a light-emitting device.

13. The method of claim 12, wherein the light-emitting device is configured to emit ultraviolet light.

14. The method of claim 12, further comprising, after forming at least a portion of the light-emitting device structure, removing at least a portion of the single-crystal AlN substrate from the light-emitting device.

15. The method of claim 12, wherein the light-emitting device comprises a light-emitting diode or a laser.

16. A method of forming single-crystal aluminum nitride (AlN), the method comprising:
(a) providing a first seed crystal (i) comprising AlN and (ii) having a growth face having an N polarity;
(b) within a first growth chamber, depositing single-crystal AlN on the first seed crystal;
(c) during at least some of the deposition of single-crystal AlN on the first seed crystal, inducing diameter expansion such that at least a portion of the single-crystal AlN has a diameter greater than a diameter of the first seed crystal;
(d) thereafter, separating a second seed crystal from the single-crystal AlN deposited on the first seed crystal, the second seed crystal (i) comprising AlN, (ii) having a growth face having an Al polarity, and (iii) having a diameter greater than the diameter of the first seed crystal; and
(e) within a second growth chamber, depositing single-crystal AlN on the second seed crystal.

17. The method of claim 16, further comprising:
(f) during at least some of the deposition of single-crystal AlN on the second seed crystal, inducing diameter expansion such that at least a portion of the single-crystal AlN has a diameter greater than a diameter of the second seed crystal;
(g) after deposition of the single-crystal AlN on the second seed crystal, separating a new second seed crystal from the single-crystal AlN, the new second seed crystal having a diameter greater than the diameter of the second seed crystal; and
(h) repeating steps (e) and (f) using the new second seed crystal produced in step (g).

18. The method of claim 17, wherein the diameter expansion during step (f) is at least approximately 10 mm for each 20 mm of axial growth of the single-crystal AlN.

19. The method of claim 17, further comprising repeating steps (g) and (h) one or more times.

20. The method of claim 16, further comprising, during at least some of the deposition of single-crystal AlN on the second seed crystal, inducing diameter expansion such that at least a portion of the single-crystal AlN has a diameter greater than a diameter of the second seed crystal.

* * * * *